(12) United States Patent
Nakai et al.

(10) Patent No.: US 9,019,777 B2
(45) Date of Patent: Apr. 28, 2015

(54) NONVOLATILE SEMICONDUCTOR MEMORY DEVICE AND OPERATING METHOD OF THE SAME

(71) Applicant: Kabushiki Kaisha Toshiba, Minato-ku, Tokyo (JP)

(72) Inventors: Tsukasa Nakai, Hino (JP); Jyunichi Ozeki, Yokosuka (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 13/787,633

(22) Filed: Mar. 6, 2013

(65) Prior Publication Data

US 2014/0063924 A1 Mar. 6, 2014

(30) Foreign Application Priority Data

Aug. 29, 2012 (JP) ................................. 2012-189094

(51) Int. Cl.

| G11C 11/00 | (2006.01) |
|---|---|
| G11C 11/02 | (2006.01) |
| G11C 5/06 | (2006.01) |
| G11C 13/00 | (2006.01) |
| G11C 11/16 | (2006.01) |
| G11C 14/00 | (2006.01) |
| G11C 7/10 | (2006.01) |
| G11C 11/56 | (2006.01) |

(52) U.S. Cl.
CPC ............ *G11C 11/16* (2013.01); *G11C 13/0004* (2013.01); *G11C 14/0045* (2013.01); *G11C 7/1006* (2013.01); *G11C 11/5678* (2013.01); *G11C 11/02* (2013.01)

(58) Field of Classification Search
CPC ............ G11C 13/0004; G11C 7/1006; G11C 11/5678; G11C 14/0045; G11C 11/02; G11C 13/0002
USPC ......................................... 365/189.2, 158, 163
See application file for complete search history.

(56) References Cited

U.S. PATENT DOCUMENTS

| 7,164,147 B2 | 1/2007 | Lee et al. |
| 7,190,613 B2 | 3/2007 | Nagase et al. |
| 7,372,125 B2 | 5/2008 | Noh et al. |
| 7,501,307 B2 | 3/2009 | Lee et al. |
| 7,521,704 B2 | 4/2009 | Lee et al. |
| 7,952,914 B2 | 5/2011 | Baek et al. |

(Continued)

FOREIGN PATENT DOCUMENTS

| JP | 11-510317 | 9/1999 |
| JP | 2004-349709 | 12/2004 |

(Continued)

*Primary Examiner* — Ly D Pham
(74) *Attorney, Agent, or Firm* — Knobbe Martens Olson & Bear LLP

(57) ABSTRACT

According to one embodiment, a nonvolatile semiconductor memory device comprises a semiconductor substrate, and a memory cell which is arranged on the semiconductor substrate and comprises a variable resistance element. The variable resistance element comprises a laminated structure including a phase-change element which has at least two different crystalline resistance states by varying a crystalline state, and a magnetoresistive element which has at least two different magnetization resistance states by varying a magnetization state, and applies or does not apply a magnetic field to the phase-change element in accordance with the magnetization state.

20 Claims, 13 Drawing Sheets

(56) References Cited

U.S. PATENT DOCUMENTS

| | | |
|---|---|---|
| 8,174,875 B2 | 5/2012 | Baek et al. |
| 8,223,533 B2 | 7/2012 | Ozeki et al. |
| 2005/0018478 A1 | 1/2005 | Nagase et al. |
| 2010/0200828 A1 | 8/2010 | Tominaga et al. |
| 2012/0025339 A1* | 2/2012 | Zhu .............................. 257/421 |
| 2012/0142160 A1* | 6/2012 | Han et al. ..................... 438/381 |

FOREIGN PATENT DOCUMENTS

| | | |
|---|---|---|
| JP | 2005-019464 | 1/2005 |
| JP | 2005-317976 | 11/2005 |
| JP | 2007-103945 | 4/2007 |
| JP | 2008-187183 | 8/2008 |
| JP | 2009-059902 | 3/2009 |
| JP | 2010-080746 | 4/2010 |
| WO | WO 97/05665 | 2/1997 |

\* cited by examiner

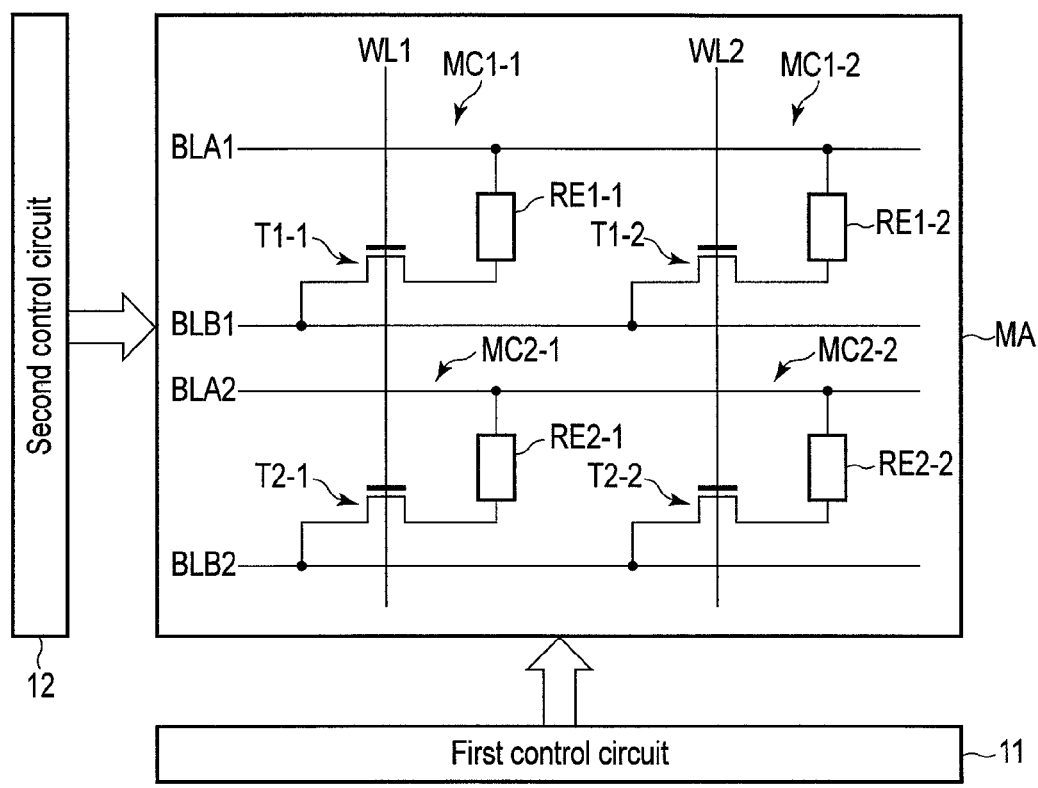
F I G. 1

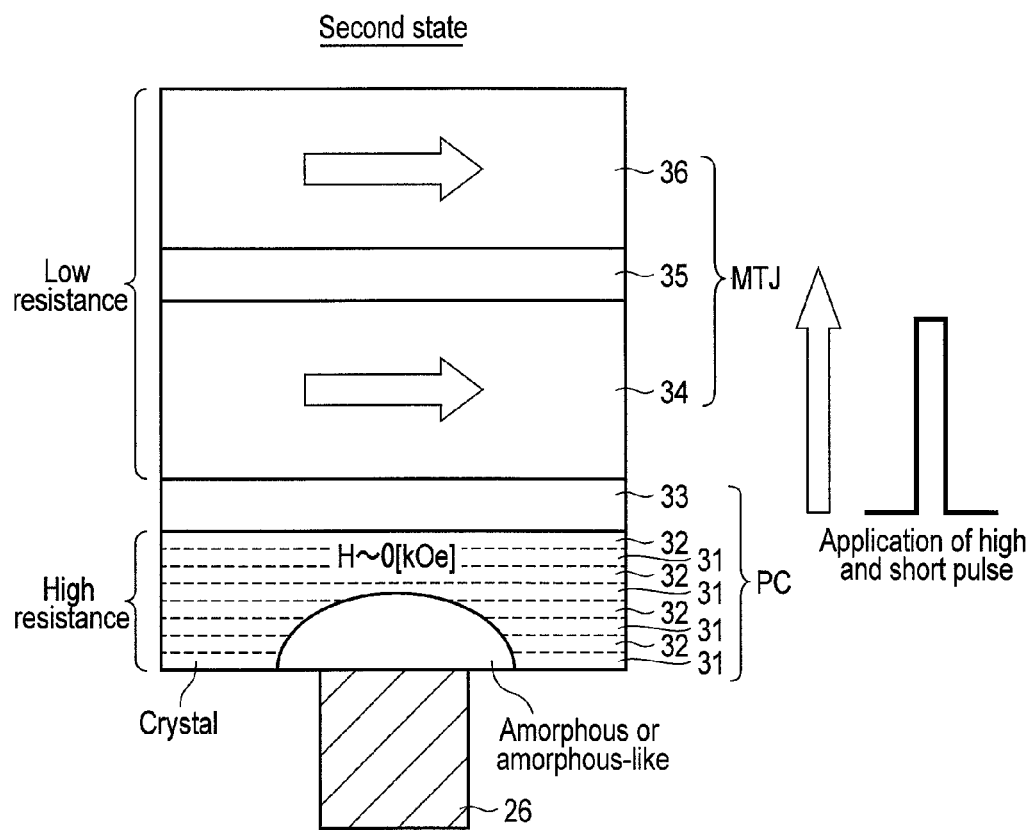
F I G. 6

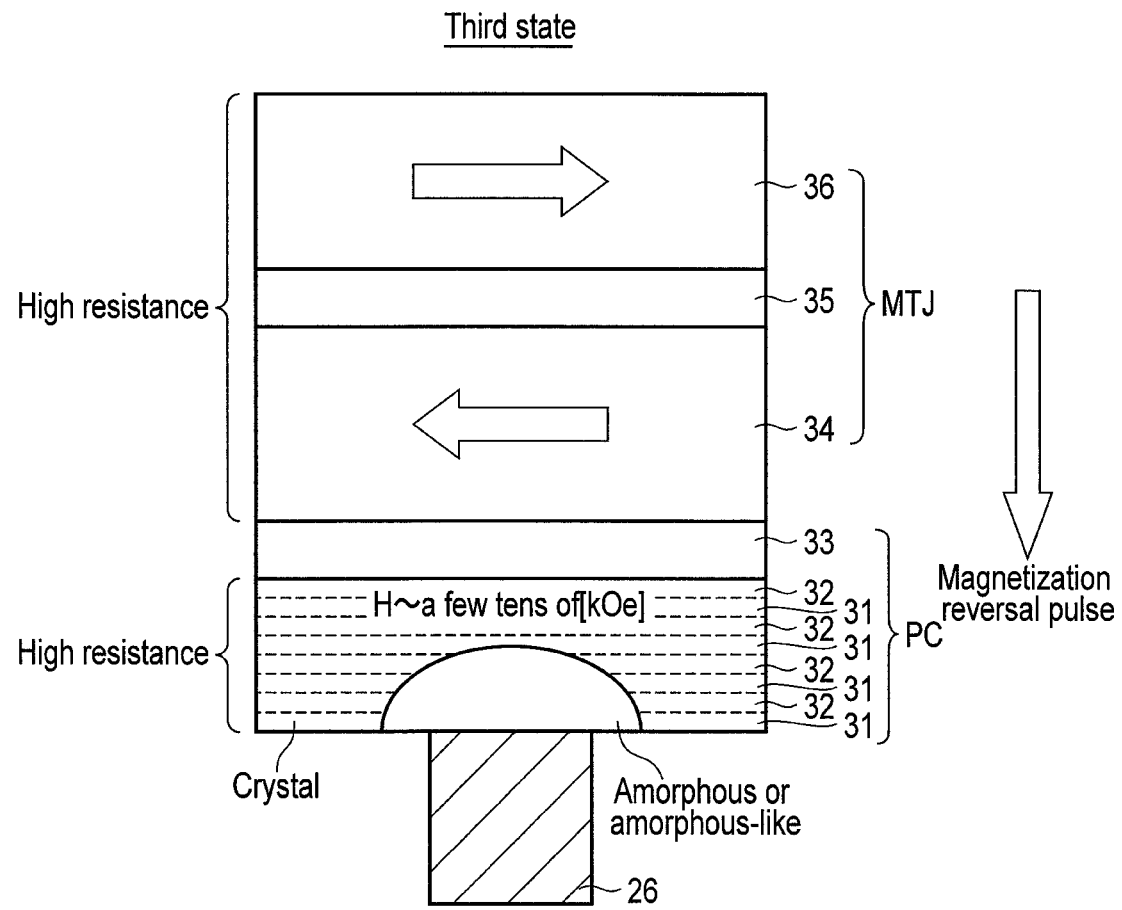
F I G. 7

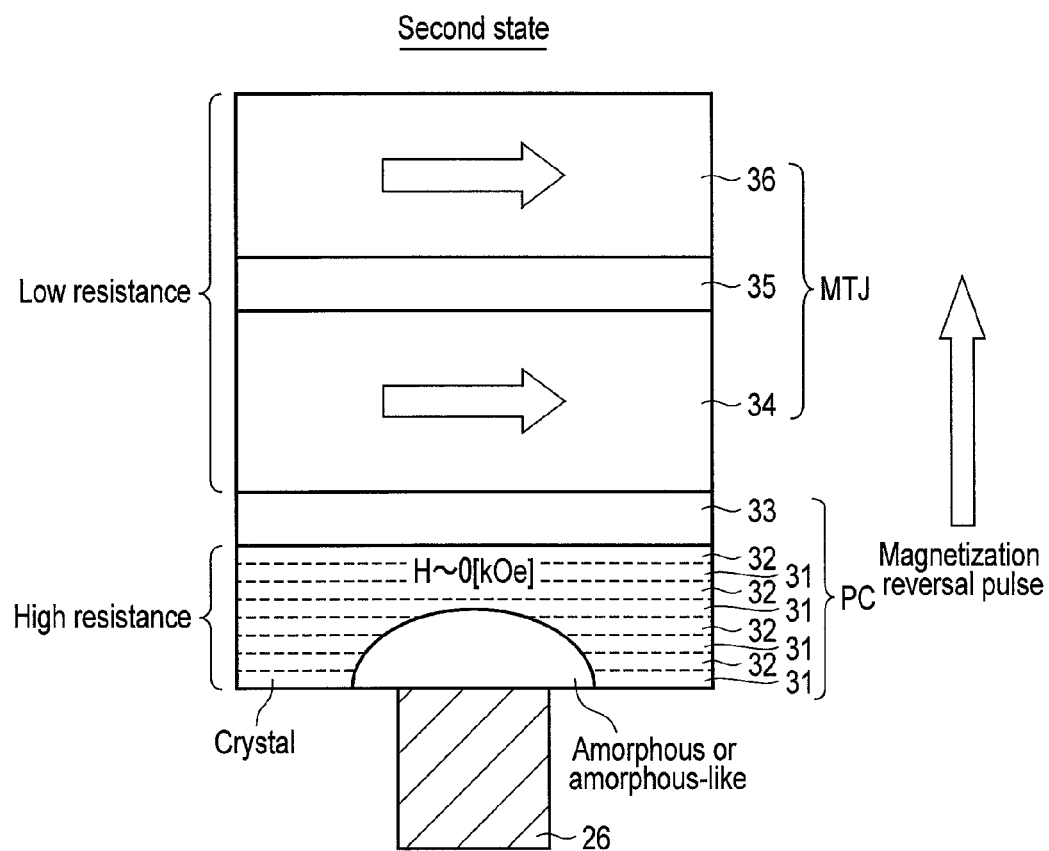
F I G. 8

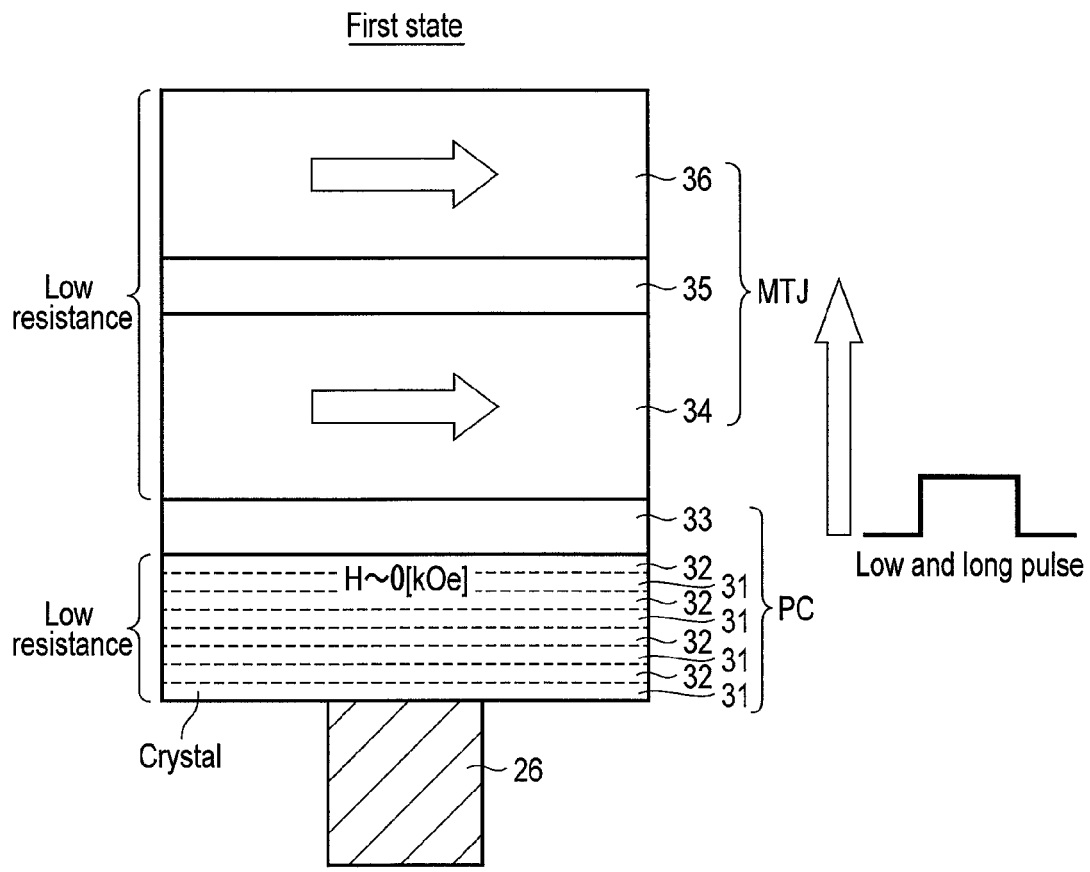
F I G. 9
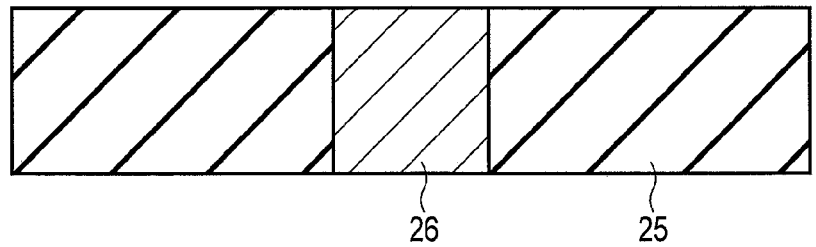
F I G. 10

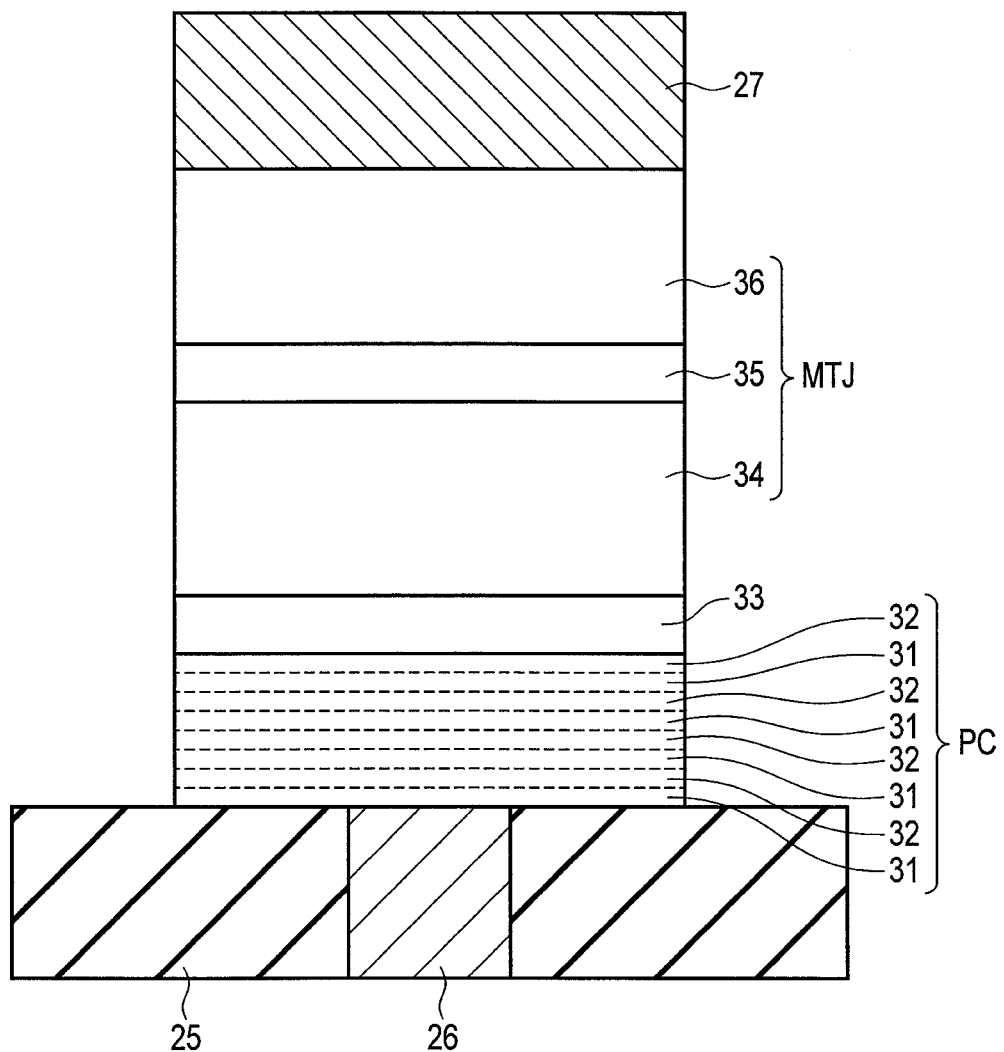
F I G. 12

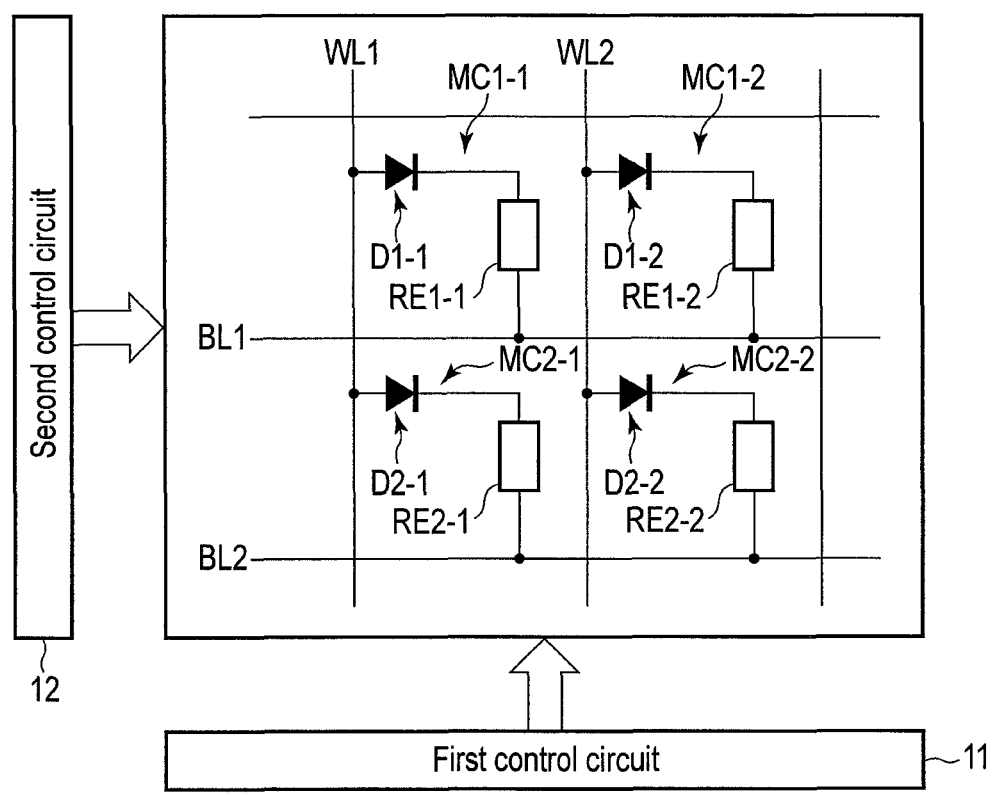
F I G. 14

NONVOLATILE SEMICONDUCTOR MEMORY DEVICE AND OPERATING METHOD OF THE SAME

CROSS-REFERENCE TO RELATED APPLICATIONS

This application is based upon and claims the benefit of priority from Japanese Patent Application No. 2012-189094, filed Aug. 29, 2012, the entire contents of which are incorporated herein by reference.

FIELD

Embodiments described herein relate generally to a nonvolatile semiconductor memory device and operating method of the same.

BACKGROUND

In recent years, many small mobile devices have become widespread. Therefore, a capacity of a nonvolatile memory mounted in each of these mobile devices increases, and a reduction in power consumption or in cost is demanded with respect to all electronic devices.

As nonvolatile semiconductor memories, memories each adopting a new system that substitute for an NAND flash memory has been conventionally proposed. There have been proposed a Ferroelectric Random Access Memory (FeRAM) or simply FRAM that utilizes ferroelectricity, a Magnetic Random Access Memory (MRAM) that utilizes a change in magnetic characteristics and a change in resistance accompanied thereby, a Phase-Change Random Access Memory (PCRAM) or simply PRAM that mainly utilizes a change in electrical resistance of a chalcogenide-based material, a Resistance Random Access Memory (ReRAM) that utilizes a resistance change phenomenon of an oxide, and others, and some of them have been put to practical use.

BRIEF DESCRIPTION OF THE DRAWINGS

FIG. 1 is a circuit diagram showing a configuration of a nonvolatile semiconductor memory device according to a first embodiment;

FIG. 5 to FIG. 9 are views showing an operation example of the nonvolatile semiconductor memory device according to the first embodiment;

FIG. 10 to FIG. 12 are cross-sectional views showing a manufacturing process of the nonvolatile semiconductor memory device according to the first embodiment;

FIG. 14 is a circuit diagram showing a modification of the configuration of the nonvolatile semiconductor memory device according to the second embodiment.

DETAILED DESCRIPTION

Figure 2:
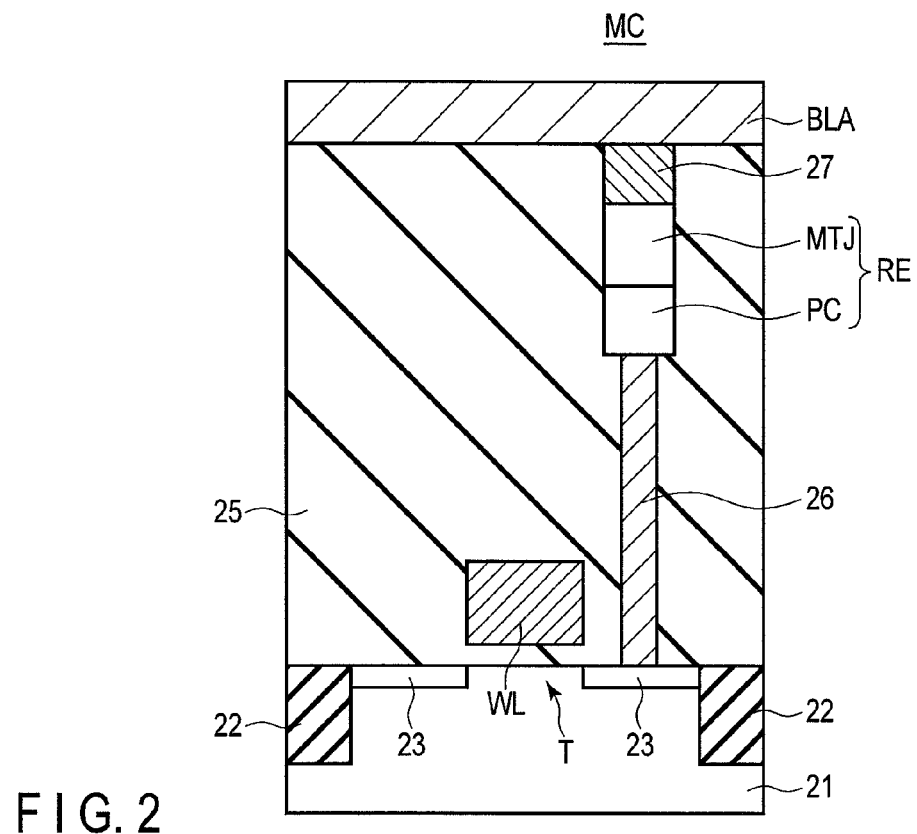
FIG. 2 is a cross-sectional view showing a configuration of the nonvolatile semiconductor memory device according to the first embodiment.

In general, according to one embodiment, a nonvolatile semiconductor memory device comprises: a semiconductor substrate; and a memory cell which is arranged on the semiconductor substrate and comprises a variable resistance element. The variable resistance element comprises a laminated structure including: a phase-change element which has at least two different crystalline resistance states by varying a crystalline state; and a magnetoresistive element which has at least two different magnetization resistance states by varying a magnetization state, and applies or does not apply a magnetic field to the phase-change element in accordance with the magnetization state.

A PRAM uses a phase-change element as a variable resistance element, changes a resistance state depending on a crystalline state of the element, and stores data. For example, a chalcogenide material is used as a phase-change material, and this chalcogenide material is changed between a crystalline phase and an amorphous phase. To this PRAM is applied a material technology used in rewritable optical discs such as a CD-RW or a DVD-RAM put into practical use before semiconductor devices.

A material used for storage, or erasing of data (a phase-change material) adopted in the phase-change element is reversibly changed between a crystalline state and an amorphous state by applying an appropriately adjusted current and increasing or decreasing a temperature. At this time, adjusting a heating temperature and a cooling rate enables the crystalline state and the amorphous state to be controlled.

More specifically, when a current having a high and short pulse is allowed to flow through the phase-change material in the crystalline state or an adjacent heat generating layer, a temperature of the phase-change material is increased to a melting point or a higher point, and then the material is rapidly cooled. As a result, the phase-change material varies from the crystalline state to the amorphous state. On the other hand, when a current having a low and long pulse is allowed to flow through the phase-change material in the amorphous state or an adjacent heat generating layer, a temperature of the phase-change material is increased to a temperature that is not lower than a crystallization temperature and not higher than a melting point, and then the material is slowly cooled. As a result, the phase-change material varies from the amorphous state to the crystalline state.

Here, the phase change of the phase-change material between the crystalline state and the amorphous state has been described, but the present embodiment is not restricted thereto. The PRAM can store data even in a phase change between the crystalline state and another crystalline state (which will be referred to as an amorphous-like state hereinafter) of the phase-change material. In the following explanation, the amorphous state includes the amorphous-like state unless otherwise discriminated.

In general, an electrical resistivity in the crystalline state is different from that in the amorphous state, and the electrical resistivity in the amorphous state is higher than that in the crystalline state. When a difference between electrical resistance of a portion in the crystalline state and electrical resistance of a portion in the amorphous state can be utilized, binary 1 and 0 can be stored. Further, the phase-change element can perform multi-level storage by changing a pulse application state.

However, in the PRAM, the following problems may occur.

In the case of varying the phase-change material from the crystalline state to the amorphous state in the PRAM, the temperature of the material must be temporarily increased to a melting point or a higher point. Therefore, relatively large current and voltage are required, and reducing power consumption of the element is difficult.

Furthermore, the PRAM involves a structural change of an atomic structure like a change between the crystalline state and the amorphous state. Therefore, when the number of times of performing rewrite operations is increased, completely suppressing segregation or the like of elements is difficult, and data rewrite durability is insufficient.

Moreover, in the PRAM, the crystalline state is subjected to phase change by heating using a current. Therefore, when an influence of heat interference contributes to the phase-change material because of miniaturization, data retention characteristics also deteriorate.

On the other hand, the MRAM uses the Tunneling Magneto Resistive (TMR) effect, changes a resistance state depending on a magnetization state of a Magnetic Tunnel Junction (MTJ) element, and stores data. In general, the MTJ element comprises a magnetic layer called a memory layer, a magnetic layer called a reference layer, and a nonmagnetic layer provided between these magnetic layers.

In the MRAM, the magnetization direction of the reference layer is invariable, and the magnetization direction of the memory layer is variable. Moreover, changing the magnetization direction of the memory layer enables the magnetization direction of the reference layer and the magnetization direction of the memory layer to be set to a parallel (P) state (a magnetization state in the same direction) or an antiparallel (A) state (a magnetization state in opposite directions). In general, electrical resistance in the P-state is smaller than electrical resistance in the A-state. In the MRAM, utilizing a difference between these electrical resistances enables binary 1 and 0 to be stored.

An MRAM that utilizes a spin-polarized current has been proposed. According to this MRAM, just allowing the spin-polarized current to flow through the magnetic layer enables magnetization reversal of the magnetic layer based on a function of spin-polarized electrons. Additionally, if the magnetic layer has a small volume, a smaller quantity of spin-polarized electrons to be transferred can suffice, and hence both miniaturization of the element and realization of a low current can be achieved.

However, the MRAM has a problem that a resistance ratio of ON/OFF (1/0) is small and insufficient as compared with that of the PRAM.

The problems in the PRAM and the MRAM become more obvious as miniaturization advances.

On the other hand, in this embodiment, the phase-change element is combined with the MTJ element, and an operation associated with this combination is controlled, whereby the problems of the PRAM and the MRAM are solved.

This embodiment will now be described hereinafter with reference to the accompanying drawings. In the drawings, like reference numerals denote like parts. Further, a tautological description will be given as required.

First Embodiment

A nonvolatile semiconductor memory device according to a first embodiment will now be described with reference to FIG. 1 to FIG. 12. A first embodiment is an example that a variable resistance element RE is formed of a laminated structure of a phase-change element PC and a magnetoresistive element MTJ. As a result, a low-current operation can be realized, and data rewrite durability, data retention characteristics, and an ON/OFF resistance ratio can be improved. The first embodiment will now be explained hereinafter in detail.

[Configuration]

First, a configuration of a nonvolatile semiconductor memory device according to the first embodiment will be explained with reference to FIG. 1 to FIG. 3.

FIG. 1 is a circuit diagram showing a configuration of the nonvolatile semiconductor memory device according to the first embodiment.

As shown in FIG. 1, memory cells MC1-1, MC1-2, MC2-1, and MC2-2 in a memory cell array MA are arranged in a matrix form. Memory cell MC1-1 comprises a series-connected body of a variable resistance element RE1-1 and a switching element (for example, FET) T1-1. Likewise, memory cell MC1-2 comprises a series-connected body of a variable resistance element RE1-2 and a switching element T1-2, memory cell MC2-1 comprises a series-connected body of a variable resistance element RE2-1 and a switching element T2-1, and a memory cell MC2-2 comprises a series-connected body of a variable resistance element RE2-2 and a switching element T2-2.

One end of each of the series-connected bodies of memory cells MC1-1 and MC1-2 (one end of each of variable resistance elements RE1-1 and RE1-2) is connected to a bit line BLA1 in common, and the other end of each of the series-connected bodies (one end of each of switching elements T1-1 and T1-2) is connected to a bit line BLB1 in common. On the other hand, one end of each of the series-connected bodies of memory cells MC2-1 and MC2-2 (one end of each of variable resistance elements RE2-1 and RE2-2) is connected to a bit line BLA2 in common, and the other end of each of the series-connected bodies (one end of switching elements T2-1 and T2-2) is connected to a bit line BLB2 in common.

Control terminals of switching elements T1-1 and T2-1, for example, gate electrodes of FETs are connected to a word line WL1 in common, and control terminals of switching elements T1-2 and T2-2 are connected to a word line WL2 in common.

Potentials on word lines WL1 and WL2 are controlled by a first control circuit 11. Further, potentials on bit lines BLA1, BLA2, BLB1, and BLB2 are controlled by a second control circuit 12.

FIG. 2 is a cross-sectional view showing the configuration of the nonvolatile semiconductor memory device according to the first embodiment. Here, one memory cell MC in FIG. 1 is shown.

As shown in FIG. 2, the memory cell MC is constituted of a switching element T arranged on a semiconductor substrate 21 and a variable resistance element RE.

The semiconductor substrate 21 is, for example, a silicon substrate, and its conductivity type can be either a P-type or an N-type. In the semiconductor substrate 21, as an element isolation insulating layer 22, for example, a silicon oxide ($SiO_2$) layer having an STI structure is arranged. It is to be noted that the STI structure is extended in a parallel direction (a vertical direction on a plane of paper) with respect to word line WL in FIG. 2, but the present embodiment is not restricted thereto, and it may be extended in a vertical direction (a parallel direction on a plane of paper) with respect to the word line WL.

In a surface region of the semiconductor substrate 21, which is specifically an element region (an active area) surrounded by the element isolation insulating layer 22, the switching element T is arranged. In this example, the switching element T is an FET, and it has two source/drain diffusion layers 23 in the semiconductor substrate 21 and a gate electrode arranged on a channel region between these layers. The gate electrode functions as the word line WL. The switching element T is covered with an interlayer insulating layer (for example, $SiO_2$) 25.

A contact hole is provided in the interlayer insulating layer 25, and a contact plug (a lower electrode) 26 is arranged in the contact hole. A lower surface of the contact plug 26 is connected to the switching element T. In this example, the contact plug 26 is directly in contact with the source/drain diffusion layer 23. The contract plug 26 is made of a metal material having relatively large resistance such as W, WN, Ti, TiN, TiSiN, Ta, TaN, or TaSiN. As a result, the contact plug 26 functions as a heat generating layer that can locally change a temperature of a later-described phase-change element PC.

A variable resistance element RE is arranged immediately above the contact plug 26. The variable resistance element RE according to the first embodiment is constituted of a laminated structure of the phase-change element PC and a magnetoresistive element MTJ.

Particulars of the variable resistance element RE according to the first embodiment will be described later.

A via (an upper electrode 27) is formed on the variable resistance element RE, and the variable resistance element RE is connected to a bit line (for example, Cu) BLA through the upper electrode 27 (for example, W).

Figure 3:
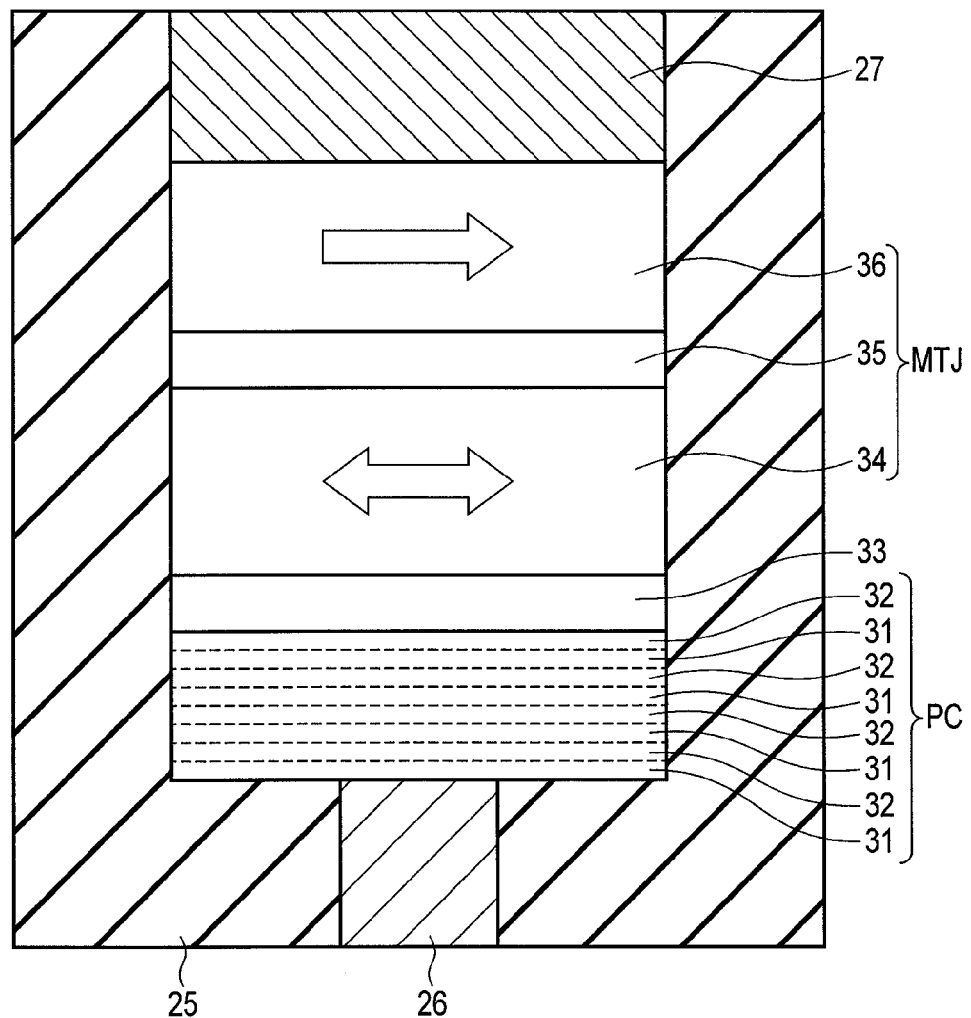
FIG. 3 is an enlarged cross-sectional view of a variable resistance element in FIG. 2.

FIG. 3 is an enlarged cross-sectional view of the variable resistance element RE in FIG. 2.

As shown in FIG. 3, the variable resistance element RE according to the first embodiment comprises the phase change element PC and the magnetoresistive element MTJ formed on the contact plug 26.

The phase change element PC is formed to be in contact with the upper side of the contact plug 26. The phase change element PC is constituted of a laminated structure in which first layers 31 and second layers 32 are alternately laminated.

The first layer 31 is made of, for example, $Sb_2Te_3$, and its film thickness is approximately 1.0 nm. The first layer 31 is formed on the contact plug 26 as the lowermost layer in the phase change element PC. The second layer 32 is made of, for example, GeTe, and its film thickness is approximately 0.4 nm. Since these first layers 31 and second layers 32 are alternately laminated, the phase change element PC has a superlattice structure.

In addition, it is desirable for the first layer 31 formed as the lowermost layer in the phase change element PC to have a film thickness larger than those of the first layers 31 provided above, and this film thickness is approximately 5.0 nm. As a result, the first layer 31 as the lowermost layer serves as a buffer layer on the interface with respect to the contact plug 26.

The phase-change element PC is reversibly changed between a crystalline state and an amorphous state by allowing an appropriately adjusted current to flow in a direction perpendicular to a film surface and increasing or decreasing a temperature. At this time, adjusting a heating temperature and a cooling rate controls a phase change between the crystalline state and the amorphous state.

More specifically, data is written into or erased from the phase-change element PC as follows.

When a high and short pulse current is applied to a phase-change material in the crystalline state, a temperature of the phase-change material is increased to a melting point or a higher point. Then, this material is rapidly cooled. As a result, the phase-change material varies from the crystalline state to the amorphous state. In this amorphous state, the phase-change element PC has the highest resistance value.

On the other hand, when a low and long pulse is applied to the phase-change material in the amorphous state, a temperature of the phase-change material is increased to a temperature that is not lower than a crystallization temperature and not greater than the melting point, and then it is gradually lowered. As a result, the phase-change material varies from the amorphous state to the crystalline state. In this crystalline state, the phase-change element PC has the lowest resistance value.

It is to be noted that, when the phase-change element PC has the laminated structure of the first layers 31 made of $Sb_2Te_3$ and the second layers 32 made of GeTe, namely, the so-called superlattice structure, the amorphous-like state can be provided rather than the amorphous state.

More specifically, when an appropriately adjusted pulse current is applied to the phase-change element PC, Ge in each second layer 32 made of GeTe moves (diffuses) toward a so-called b-site from a so-called a-site in an NaCl structure. It is to be noted that a crystal structure of GeTe is an NaCl structure or a rhombohedron structure obtained by slightly distorting the NaCl structure, and Ge and some vacancies are arranged in the a-site whilst Te is arranged in the b-site, respectively. More specifically, when Ge in each second layer 32 is moved to the interface layer with respect to each first layer 31, a high-resistance state which is the so-called amorphous-like state can be obtained. On the other hand, when Ge in each second layer 32 is moved from the interface side with respect to each first layer 32 into the second layer 32, a low-resistance state which is the so-called crystalline state can be obtained.

At this time, since the first layer 31 has a crystallization temperature lower than that of GeTe, it is constantly in the crystallization state, and this state does not vary. That is, when the crystalline state of each second layer 32 in the phase-change element PC alone is subjected to phase change, the resistance state can be varied.

On the phase-change element PC, a barrier layer 33 is formed through a non-illustrated upper electrode. In other words, the barrier layer 33 is formed between the phase-change element PC and the magnetoresistive element MTJ. The barrier layer 33 prevents elements from diffusing into the phase-change element PC and the magnetoresistive element MTJ. Furthermore, the barrier layer 33 is used for the purpose of improving crystallinity of a layer forming the magnetoresistive element MTJ (for example, a later-described memory layer 34). The barrier layer 33 contains at least one of Ag, Al, Au, Cr, Ru, Ta, Ti, Pd, and Pt. It is to be noted that the upper electrode is made of the same material as, for example, the contact plug 26, namely, W, WN, Ti, TiN, TiSiN, Ta, TaN, TaSiN, or the like.

The magnetoresistive element MTJ is formed on the phase-change element PC via the barrier layer 33. The magnetoresistive element MTJ is formed of, for example, the memory layer 34, a tunnel barrier layer 35, and a reference layer 36.

The memory layer 34 is formed on the barrier layer 33 through the non-illustrated lower electrode. The memory layer 34 is a ferromagnetic layer having a variable magnetization direction, and it has in-plane magnetization that is parallel or substantially parallel to a film surface (an upper surface/a lower surface). Here, "the magnetization direction is variable" means that the magnetization direction varies with respect to a predetermined write current. Moreover, "substantially parallel" means that a direction of remnant magnetization is in the range of $0° \leq \theta \leq 45°$ with respect to the film surface.

Moreover, the memory layer 34 is made of, for example, TbCoFe as a main body layer and, for example, CoFeB as an interface layer (the interface side with respect to the tunnel barrier layer 35).

The tunnel barrier layer 35 is formed on the memory layer 34. The tunnel barrier layer 35 is a nonmagnetic layer, and it is made of, for example, MgO or $Al_2O_3$.

The reference layer 36 is formed on the tunnel barrier layer 35. The reference layer 36 is a ferromagnetic layer having an invariable magnetization direction, and it has in-plane magnetization that is parallel or substantially parallel to a film surface. Here, "the magnetization direction is invariable" means that the magnetization direction is invariable with respect to a predetermined write current. That is, the reference layer 36 has a larger reversal energy barrier in the magnetization direction than that of the memory layer 34.

Further, the reference layer 36 is made of, for example, TbCoFe as a main body layer and also made of, for example, CoFeB as an interlayer layer (the interface layer with respect to the tunnel barrier layer 35).

The magnetoresistive element MTJ is, for example, a spin-transfer-type magnetoresistive element. Therefore, in the case of writing data into the magnetoresistive element MTJ or reading data from the magnetoresistive element MTJ, a current is allowed to bi-directionally flow through the magnetoresistive element MTJ in a direction perpendicular to its film surface.

More specifically, data is written into or erased from the magnetoresistive element MTJ as follows.

In the case that electrons (electrons moving from the reference layer 36 toward the memory layer 34) are supplied from the upper electrode 27 side (in the case that a current flows from the memory layer 34 to the reference layer 36), spin-polarized electrons are injected into the memory layer 34 in the same direction as the magnetization direction of the reference layer 36. In this case, the magnetization direction of the memory layer 34 is set to be equal to the magnetization direction of the reference layer 36. As a result, the magnetization direction of the memory layer 34 and the magnetization direction of the reference layer 36 are aligned in parallel to each other. In this parallel alignment, the magnetoresistive element MTJ has the lowest resistance value.

On the other hand, in the case that electrons (electrons moving from the memory layer 34 toward the reference layer 36) are supplied from the lower electrode 26 side (in the case that a current flows from the reference layer 36 to the memory layer 34), the electrons spin-polarized in a direction opposite to the magnetization direction of the reference layer 36 when reflected by the reference layer 36 is injected into the memory layer 34. In this case, the magnetization direction of the memory layer 34 is set to be opposite to the magnetization direction of the reference layer 36. As a result, the magnetization direction of the memory layer 34 and the magnetization direction of the reference layer 36 are aligned in an antiparallel state. In this antiparallel alignment, the magnetoresistive element MTJ has the highest resistance value.

The upper electrode 27 is formed on the reference layer 36. The upper electrode 27 is made of a metal material having conductivity, and it is made of, for example, TiN. Moreover, the upper electrode 27 is not restricted this material, and it may be formed of a film containing one of Ti, Ta, and W or a laminated film of these materials.

A planar shape of the variable resistance element RE (the phase-change element PC and the magnetoresistive element MTJ) is, for example, a circular shape. In other words, the variable resistance element RE is formed into a pillar shape.

It is to be noted that the phase-change element PC is not restricted to the laminated structure of each first layer 31 made of $Sb_2Te_3$ and each second layer 32 made of GeTe. The second layer 32 may be made of one of GeTe and an AlTe-based material or a compound containing these materials, and the first layer 31 is made of a compound containing at least one of Sb, Te, Ag, Al, Au, Bi, Cu, Ga, In, Si, and Zn.

Additionally, the phase-change element PC may be constituted of a single-layer structure consisting of a compound containing at least one of Sb, Te, Ag, Al, Au, Bi, Cu, Ga, Ge, In, Si, and Zn. For example, it is preferable for the phase-change element PC to be constituted of a so-called tie-line composition that is referred to as a GeTe—$Sb_2Te_3$ compound in GeSbTe compounds or a composition obtained by adding Ge or the like to SbTe in an eutectic composition (which will be referred to as an eutectic system hereinafter). In the case of the eutectic system, there are compounds other than SbTe, for example, a GeSb system, a GaSb system, and others. Further, the phase-change element PC may be made of compounds containing an eutectic system or the like rather than a single compound. Furthermore, Bi or In may be added to the GeSbTe compound, or a GeBiTe compound obtained by replacing Sb in the GeSbTe compound with Bi may be used. In regard to the GeSbTe compounds, it is possible to adopt a $Ge_2Sb_2Te_5$ (a so-called 2-2-5 composition) compound or a compound obtained by adding N or O to this compound. Moreover, it is also possible to use an Sb-rich or Sb-poor composition or a GeTe-rich composition obtained by slightly changing a composition of a GeTe—$Sb_2Te_3$ compound or the GeSbTe compound. Additionally, an insulator such as $SiO_2$ may be dispersed in the GeSbTe compound. A method of adding other compositions or compounds can be likewise adopted in the eutectic system. Constituent materials (a composition) of the phase-change element PC are appropriately selected while considering a desired electrical resistivity, an amount of resistance change, a switching speed, or the like.

Further, each of the memory layer 34 and the reference layer 36 may have perpendicular magnetization that is perpendicular or substantially perpendicular to a film surface thereof. Here, "substantially perpendicular" means that a direction of remnant magnetization is in the range of $45°<\theta\leq90°$ with respect to the film surface.

Furthermore, the memory layer 34 and the reference layer 36 may be counterchanged in arrangement. That is, the reference layer 36, the tunnel barrier layer 35, and the memory layer 34 may be sequentially formed on the phase-change element PC.

Moreover, a shift adjustment layer may be formed on the reference layer 36 via a non-illustrated spacer layer (for example, Ru). The shift adjustment layer is a magnetic layer having an invariable magnetization direction, and its magnetization direction is opposite to the magnetization direction of the reference layer 36. As a result, the shift adjustment layer can cancel out a leakage magnetic field from the reference layer 36 that can reach the memory layer 34. In other words, the shift adjustment layer has an effect of adjusting toward the opposite direction the offset of reversal characteristics for the memory layer 31 by a magnetostatic leakage field from the reference layer 36. This shift adjustment layer is constituted of, for example, an artificial lattice formed of a laminated structure of, for example, a magnetic material such as Ni, Fe, or Co and a nonmagnetic material such as Cu, Pd, or Pt.

Additionally, the memory layer 34 and the reference layer 36 may have a dimension difference on a plane. For example, a diameter of the memory layer 34 on a plane may be smaller than a diameter of the reference layer 36. As a result, an electrical short circuit between the memory layer 34 and the reference layer 36 can be avoided. It is to be noted that a planar shape of the magnetoresistive element MTJ is not restricted to a circular shape, and it may be a square shape, a rectangular shape, or an elliptic shape.

Further, although the reference layer 36 is constituted of one magnetic layer and has one magnetization direction, it may be constituted of magnetic layers and has directions of magnetization combined with each other.

Furthermore, the phase-change element PC and the magnetoresistive element MTJ may be counterchanged in arrangement. That is, a configuration having the magnetoresistive element MTJ, the barrier layer 33, and the phase-change element PC sequentially laminated may be adopted as the variable resistance element RE.

In the first embodiment, the phase-change element PC is combined with the magnetoresistive element MTJ, and data is stored. Particulars of a write operation and an erase operation of the variable resistance element RE in the first embodiment will be described later.

As described above, the magnetoresistive element MTJ is constituted of at least two magnetic layers, i.e., the reference layer 36 having the invariable magnetization direction and the memory layer 34 having the variable magnetization direction. Therefore, a magnetic field is produced by these magnetic layers in the vicinity of the magnetoresistive element MTJ.

A magnetic field produced by the magnetoresistive element MTJ is applied to the phase-change element PC. A distribution of this magnetic field varies depending on the magnetization direction of the memory layer 34. Therefore, intensity of the magnetic field applied to the phase-change element PC by the magnetoresistive element MTJ can be controlled based on the magnetization direction of the memory layer 34.

For example, in a situation where the memory layer 34 and the reference layer 36 have the same magnetization direction (in the case of the P-state), the magnetoresistive element MTJ is designed in such a manner that intensity of the magnetic field applied to the phase-change element PC becomes substantially zero (in such a manner that the magnetic field is not applied). It can be designed by adjusting intensity of a magnetic field of each layer in the magnetoresistive element MTJ. It is to be noted that substantially "zero" also includes a state that a weak magnetic field that does not affect the phase-change element PC is applied. Therefore, this state can be translated into a state that the weak magnetic field is applied to the phase-change element PC.

At this time, when the magnetization direction of the memory layer 34 is changed to enter the A-state by allowing a current to flow through the magnetoresistive element MTJ, the magnetic field applied to the phase-change element PC is no longer zero. In other words, the magnetic field is applied to the phase-change element PC by the magnetoresistive element MTJ.

It is to be noted that a portion of the phase-change element PC which should be subjected to a phase change is in the vicinity of a portion of the phase-change element PC which is in contact with a heat generating (heater) layer 26 in FIG. 3. Therefore, it is not necessary to perform or suppress application of the magnetic field to the entire phase-change element PC, and designing while considering a position near the portion that is in contact with the heat generating layer 26 alone can suffice.

A crystalline state of the phase-change element PC that is determined based on presence/absence of application of the magnetic field will now be described hereinafter.

Figure 4:
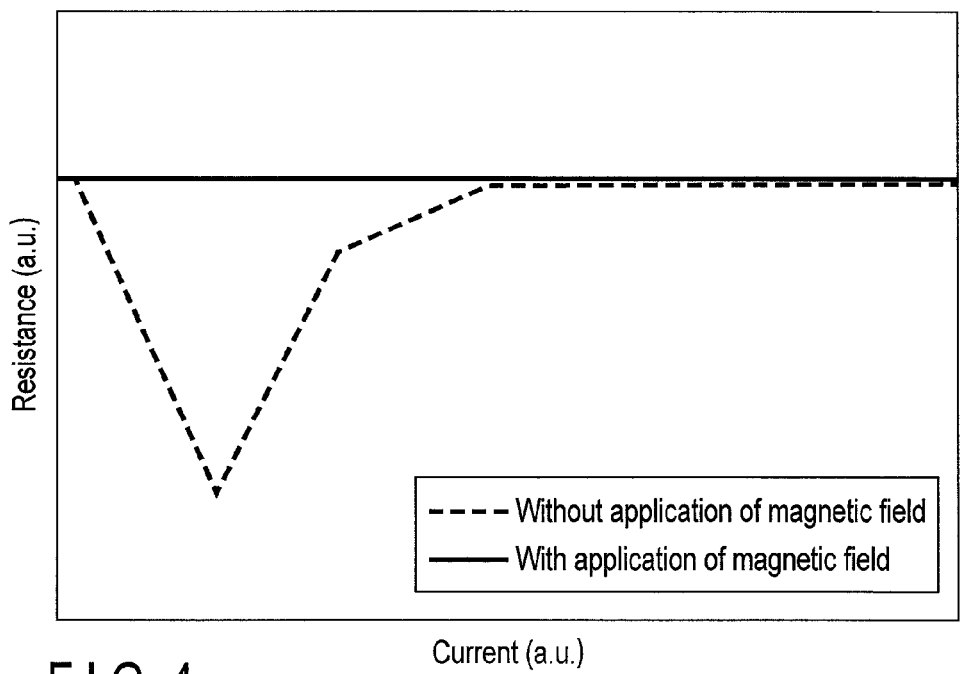
FIG. 4 is a graph showing a change in resistance value with respect to a current value according to present/absence of application of a magnetic field in a phase-change element in an amorphous state.

FIG. 4 is a graph showing a change in resistance value with respect to a current value based on presence/absence of application of the magnetic field to the phase-change element PC in the amorphous state.

As shown in FIG. 4, in the case that the magnetic field is not applied to the phase-change element PC in the amorphous state, a resistance value varies when a current is applied to the phase-change element PC. That is because the phase-change element PC changes from the amorphous state to the crystalline state by allowing the current to flow therethrough. On the other hand, in the case that the magnetic field is applied to the phase-change element PC in the amorphous state, a resistance value does not vary even though a current is allowed to flow through the phase-change element PC. That is because, when the magnetic field is applied to the phase-change element PC, it is considered that the phase-change element PC does not vary from the amorphous state to the crystalline state even though the current is allowed to flow through the phase-change element PC.

That is, when the magnetic field is applied to the phase-change element PC in the amorphous state, this element is not crystallized even though the current is allowed to flow, and data retention characteristics can be improved. In the first embodiment, when the magnetoresistive element MTJ is set to the A-state, the magnetic field is applied to the phase-change element PC, and the data retention characteristics of the phase-change element PC are improved. Furthermore, the magnetoresistive element MTJ is set to the P-state, the magnetic field to the phase-change element PC is then set to zero, and data is rewritten into (or erased from) the phase-change element PC.

It is to be noted that the magnetoresistive element MTJ is designed in such a manner that intensity of the magnetic field applied to the phase-change element PC becomes zero when the magnetoresistive element MTJ in the P-state and that the magnetic field is applied to the phase-change element PC when the same is in the A-state, but the present embodiment is not restricted thereto. The magnetoresistive element MTJ may be designed in such a manner that the intensity of the magnetic field applied to the phase-change element PC becomes zero when the magnetoresistive element MTJ is in the A-state and that the magnetic field is applied to the phase-change element PC when the same is in the P-state.

Moreover, a magnetic layer may be formed in a layer different from the magnetoresistive element MTJ. As a result, the intensity of the magnetic field applied to the phase-change element PC can be fixedly increased or decreased.

Operation Examples

Examples of a write operation and an erase operation of the nonvolatile semiconductor memory device according to the first embodiment will now be described with reference to FIG. 5 to FIG. 9.

FIG. 5 to FIG. 9 are views showing operation examples of the nonvolatile semiconductor memory device according to the first embodiment, and they represents cross-sectional views of the variable resistance element RE according to the first embodiment.

Here, a description will be given as to an example that the magnetoresistive element MTJ is designed in such a manner that the intensity of the magnetic field applied to the phase-change element PC becomes zero when the magnetoresistive element MTJ is in the P-state and that the magnetic field is applied to the phase-change element PC when the same is in the A-state. More specifically, the magnetoresistive element MTJ is designed in such a manner that the intensity of the magnetic field near an interface with respect to the heat generating layer (the contact plug 26) in the phase-change element PC becomes approximately 10 kOe when the magnetoresistive element MTJ is in the A-state and that this intensity becomes substantially zero when the same is in the P-state.

In a composite element of the phase-change element PC and the magnetoresistive element MTJ according to the first embodiment, when a current pulse is applied to the phase-change element PC and the magnetoresistive element MTJ, the magnetization state of the magnetoresistive element MTJ and the crystalline state of the phase-change element PC are changed, thereby data is stored in the elements.

Resistances of the phase-change element PC and the magnetoresistive element MTJ are set to low-resistance states in an initial status, and the resistances of both the phase-change element PC and the magnetoresistive element MTJ are changed to a high-resistance state when data is stored. That is, the two elements (the phase-change element PC and the magnetoresistive element MTJ) function as one information memory element (the variable resistance element RE). It is to be noted that multi-level storage is enabled by a combination of the magnetization state of the magnetoresistive element MTJ and the crystalline state of the phase-change element PC, and the case of two-level storage will be explained here.

Examples of the write operation and the erase operation of the nonvolatile semiconductor memory device according to the first embodiment will now be described hereinafter in more detail.

The write operation will be first explained.

Figure 5:
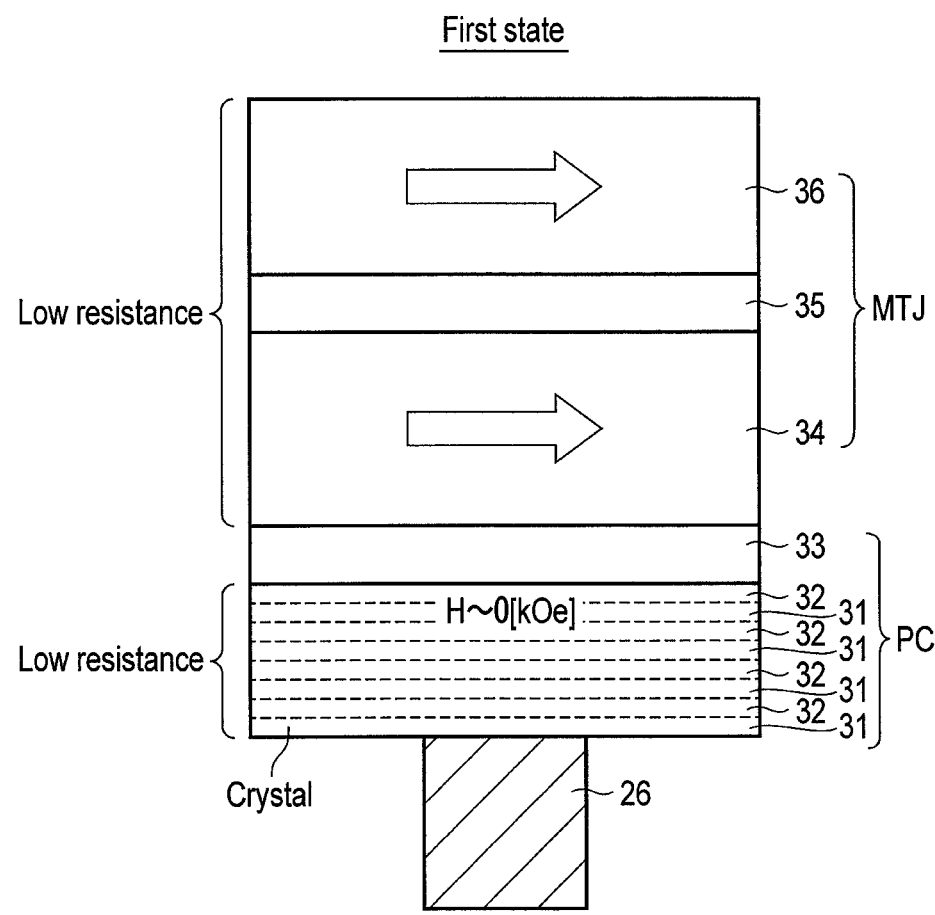

First, as shown in FIG. 5, the variable resistance element RE is set in such a manner that the magnetoresistive element MTJ enters the P-state and the phase-change element PC enters the crystalline state. That is, both the magnetoresistive element MTJ and the phase-change element PC are set to the low-resistance state. This is determined as an initial state (a first state) corresponding to an OFF state where no data is written. At this time, intensity H of a magnetic field applied to the phase-change element PC by the magnetoresistive element MTJ is substantially zero.

Then, as shown in FIG. 6, a current pulse is applied from the lower electrode 26 toward the upper electrode 27 (from the phase-change element PC toward the magnetoresistive element MTJ) with respect to the variable resistance element RE in the first state. This direction is determined as a forward direction. This current pulse is a short pulse having relatively high intensity (a high and short pulse, for example, 1.5 V, 20 ns). As a result, the phase-change element PC varies from the crystalline state to the amorphous state. At this time, amorphization of the phase-change element PC starts from a portion near the lower electrode 26 which is the heat generating layer. Therefore, even if the entire phase-change element PC does not enter the amorphous state, the portion near the lower electrode 26 which is the heat generating layer alone may be amorphized. On the other hand, in the case of a current in the forward direction (in the case that electrons move from the reference layer 36 toward the memory layer 34), the P-state of the magnetoresistive element MTJ does not vary.

As described above, the phase-change element PC enters the high-resistance state, and the magnetoresistive element MTJ remains in the low-resistance state. This is determined as a second state.

Then, as shown in FIG. 7, a current pulse is applied from the upper electrode 27 toward the lower electrode 26 (from the magnetoresistive element MTJ toward the phase-change element PC) with respect to the variable resistance element RE in the second state. This direction is determined as a reverse direction. This current pulse is a magnetization reversal pulse that reverses magnetization of the memory layer 34 in the magnetoresistive element MTJ without destroying the amorphous state of the phase-change element PC (for example, a pulse of 0.4 V and 0.5 ns is applied once or more). As a result, electrons flow from the memory layer 34 to the reference layer 36, and the magnetoresistive element MTJ changes from the P-state to the A-state.

On the other hand, in the case of a current pulse in the reverse direction, the amorphous state of the phase-change element PC does not vary. That is because heat which changes a phase of the phase-change element PC is given by heat generation of the lower electrode 26. That is, in the case of applying the current pulse in the reverse direction, there is substantially no heat generation source, the phase-change element PC is not heated, and hence the crystalline state is not changed. Therefore, a small current does not have to be used while considering a change in crystalline state of the phase-change element PC, and a switching speed of the element is not affected.

As described above, the magnetoresistive element MTJ enters the high-resistance state, and the phase-change element PC remains in the high-resistance state. This is determined as a third state. The third state is a state with the highest resistance corresponding to an ON state that data has been written. As a result, the data write operation is completed.

The erase operation will now be described. In the third state, when the magnetoresistive element MTJ enters the A-state, a magnetic field is applied to the phase-change element PC. At this time, the intensity H of the magnetic field applied to the phase-change element PC by the magnetoresistive element MTJ is approximately 10 kOe.

First, as shown in FIG. 8, a current pulse is applied in the forward direction with respect to the variable resistance element RE in the third state. This current pulse is a magnetization reversal pulse that reverses magnetization of the memory layer 34 in the magnetoresistive element MTJ (for example, a pulse of 0.4 V and 0.5 ns is applied once or more). As a result, electrons flow to the memory layer 34 from the reference layer 36, and the magnetoresistive element MTJ changes from the A-state to the P-state. Therefore, the intensity H of the magnetic field applied to the phase-change element PC by the magnetoresistive element MTJ is substantially zero.

On the other hand, in the third state, since the magnetoresistive element MTJ is in the A-state, the magnetic field is applied to the phase-change element PC. Therefore, the amorphous state of the phase-change element PC is not changed by the magnetization reversal pulse.

In this manner, the magnetoresistive element MTJ enters the low-resistance state, and the phase-change element PC remains in the high-resistance state. That is, the current state returns to the second state.

Then, as shown in FIG. 9, a current pulse is applied in the forward direction with respect to the variable resistance element RE in the second state. This current pulse is a long pulse having relatively low intensity (a low and long pulse, for example, 0.6 V, 1 μs). As a result, the phase-change element PC varies from the amorphous state to the crystalline state. At this time, since the current pulse in the forward direction is applied in the immediately previous operation (the operation in FIG. 8), heat generation of the lower electrode 26 is started, and a temperature of the phase-change element PC is increased. Therefore, in the phase-change element PC in the amorphous state invariable by the magnetic field of the magnetoresistive element MTJ, crystallization begins when the magnetoresistive element MTJ enters the P-state and the magnetic field becomes zero. Therefore, the current pulse in the forward direction applied at this step may be a pulse of a relative short time. On the other hand, in the case of a current in the forward direction, the P-state of the magnetoresistive element MTJ does not vary.

As described above, the magnetoresistive element MTJ and the phase-change element PC return to the first state, and the data erase operation is completed.

A read operation will now be described.

A read current is supplied to the magnetoresistive element MTJ and the phase-change element PC. This read current is set to a value with which the magnetization state of the magnetoresistive element MTJ and the crystalline state of the phase-change element PC do not vary (a value smaller than the write current). When changes in resistance values of the magnetoresistive element MTJ and the phase-change element PC at this moment are detected, a semiconductor device that can operate as a memory can be provided.

It is to be noted that the description has been given as to the example of the two-level writing in which the first state is the OFF state and the third state is the ON state, but the present embodiment is not restricted thereto. When the first state to the third state are used, four-level storage or further multi-level storage can be executed.

[Manufacturing Method]

A manufacturing method of the nonvolatile semiconductor memory device according to the first embodiment will now be described with reference to FIG. 10 to FIG. 12.

Figure 11:
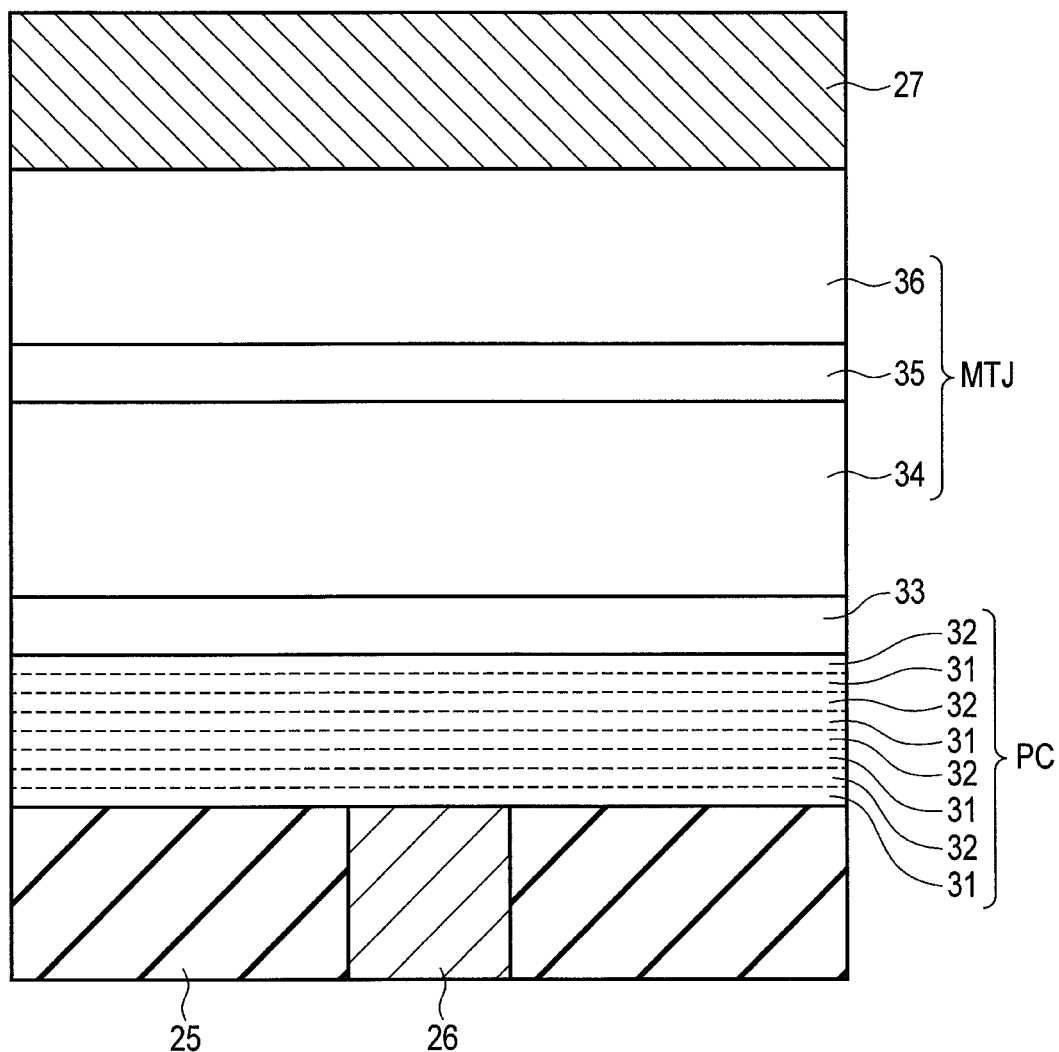

FIG. 10 to FIG. 12 are cross-sectional views showing a manufacturing process of the nonvolatile semiconductor memory device according to the first embodiment. Here, a manufacturing process of the variable resistance element RE will be described in particular.

First, a transistor T constituted of a gate electrode which will serve as a word line WL and a diffusion layer is formed on the semiconductor substrate 21. Then, the interlayer insulating layer 25 is formed on the entire surface to cover the transistor T.

Then, as shown in FIG. 10, a contact hole is formed in the interlayer insulating layer 25 to reach the diffusion layer of the transistor T. The contact plug 26 is formed on the entire surface to fill this contact hole. Subsequently, the contact plug 26 formed outside the contact hole is removed, and the upper surface of flattened. The contact plug 26 is made of a metal material having relatively high resistance, for example, W, WN, Ti, TiN, TiSiN, Ta, TaN, or TaSiN.

Then, as shown in FIG. 11, the phase-change element PC is formed on the interlayer insulating layer 25 and the contact plug 26.

More specifically, the first layers 31 and the second layers 32 are alternately laminated on the interlayer insulating layer 25 and the contact plug 26 by, for example, a sputtering deposition method (a physical vapor deposition (PVD) method), a chemical vapor deposition (CVD) method or an atomic layer deposition (ALD) method. The first layer 31 is made of, for example, $Sb_2Te_3$, and its film thickness is approximately 1.0 nm. The second layer 32 is made of, for example, GeTe, and its film thickness is approximately 0.4 nm. These first layers 31 and second layers 32 are alternately laminated, whereby the phase-change element PC has a superlattice structure.

In addition, it is desirable for the first layer 31 formed as the lowermost layer in the phase-change element PC to have a film thickness larger than those of the first layers 31 placed above, and its film thickness is approximately 5.0 nm. As a result, the first layer 31 as the lowermost layer serves as a buffer layer on an interface with respect to the contact plug 26.

In this manner, the phase-change element PC is formed.

Then, based on, for example, the PVD or CVD method, a non-illustrated upper electrode is formed on the phase-change element PC, and then the barrier layer 33 is formed. The barrier layer 33 prevents elements from mutually diffusing into the phase-change element PC and the magnetoresistive element MTJ. Further, the barrier layer 33 is also used for the purpose of improving crystallinity of a layer constituting the magnetoresistive element MTJ (for example, the later-described memory layer 34). The barrier layer 33 contains at least one of Ag, Al, Au, Cr, Ru, Ta, Ti, Pd, and Pt.

Then, the magnetoresistive element MTJ is formed on the barrier layer 33.

More specifically, first, based on, for example, the PVD method, the memory layer 34 is formed on the barrier layer 33. The memory layer 34 is a ferromagnetic layer having a variable magnetization direction, and it is made of, for example, TbCoFe as a main body layer and also made of, for example, CoFeB as an interface layer (an interface side with respect to the tunnel barrier layer 35).

Then, based on, for example, the PVD method, the tunnel barrier layer 35 is formed on the memory layer 34. This layer is a nonmagnetic layer, and it is made of, for example, MgO or $Al_2O_3$.

Subsequently, the reference layer 36 is formed on the tunnel barrier layer 35 by, for example, the PVD method. The reference layer 36 is a ferromagnetic layer having an invariable magnetization direction, and it is made of, for example, TbCoFe as a main body layer and also made of, for example, CoFeB as an interface layer (the interface side with respect to the tunnel barrier layer 35).

In this manner, the magnetoresistive element MTJ is formed.

Then, based on, for example, the PVD or CVD method, the upper electrode 27 is formed on the reference layer 36. The upper electrode 27 is made of a metal material having conductivity, and it is made of, for example, TiN. Additionally, this electrode is not restricted to this configuration, and it may be formed of a film containing one of Ti, Ta, and W or a laminated film of these films.

Subsequently, as shown in FIG. 12, for example, based on dry etching such as reactive ion etching (RIE), the upper electrode 27, the magnetoresistive element MTJ, the barrier layer 33, and the phase-change element PC are collectively processed. As a result, a planar shape of each of the upper electrode 27, the magnetoresistive element MTJ, the barrier layer 33, and the phase-change element PC becomes, for example, a circular shape. In other words, the upper electrode 27, the magnetoresistive element MTJ, the barrier layer 33, and the phase-change element PC are formed into a pillar shape.

Then, the interlayer insulating layer 258 is formed on the entire surface, and the upper electrode 27, the magnetoresistive element MTJ, the barrier layer 33, and the phase-change element PC are covered. Subsequently, the upper surface of the interlayer insulating layer 25 is flattened, and the upper surface of the upper electrode 27 is exposed. Further, the bit line BLA is formed on the upper electrode 27, and electrical connection is achieved.

In this manner, the variable resistance element RE according to the first embodiment is formed.

In addition, it is desirable to form the insulating layer made of SiN on side surfaces of the magnetoresistive element MTJ and the phase-change element PC after the upper electrode 27, the magnetoresistive element MTJ, the barrier layer 33, and the phase-change element PC are formed and before the interlayer insulating layer 25 is formed. As a result, the side surface of each element can be protected.

Furthermore, a diameter of the variable resistance element RE is, for example, 40 nm. When an aspect ratio of the variable resistance element becomes higher as the element is further miniaturized, there is concern that the pillar of the variable resistance element RE may fall. In this case, the magnetoresistive element MTJ and the phase-change element PC may be individually processed into the pillar shape without collectively processing the magnetoresistive element MTJ and the phase-change element PC.

For example, after the phase-change element PC is formed, the phase-change element PC is processed into a pillar shape. Thereafter, the phase-change element PC is covered with the interlayer insulating layer 25, and the upper surface is flattened. Subsequently, the magnetoresistive element MTJ (and the barrier layer 33) is formed on the phase-change element PC and the interlayer insulating layer 25, and then the magnetoresistive element MTJ is processed into the pillar shape. Thereafter, magnetoresistive element MTJ is covered with the interlayer insulating layer 25, and its upper surface is flattened. As a result, the pillar of the variable resistance element RE can be prevented from falling.

[Effect]

According to the first embodiment, the variable resistance element RE is formed of the laminated structure of the phase-change element PC and the magnetoresistive element MTJ. More specifically, as the variable resistance element RE, the phase-change element PC having the superlattice structure is formed on the heat generating layer (the lower electrode 26), and the magnetoresistive element MTJ comprising the memory layer 34, the tunnel barrier layer 35, and the reference layer 36 is formed on the phase-change element PC. These two elements (the phase-change element PC and the magnetoresistive element MTJ) constitute one information memory element (the variable resistance element RE). As a result, the following effects can be obtained.

According to a lone phase-change element of a comparative example, resistances in the ON/OFF states are 10 and 1.1 kΩ, respectively. Further, according to a lone magnetoresistive element of the comparative example, resistances in the ON/OFF states are 10 and 8 kΩ, respectively. On the other hand, according to the variable resistance element RE of the first embodiment, the low-resistance state of both the phase-change element PC and the magnetoresistive element MTJ is determined as the OFF state, and the high-resistance state of both the phase-change element PC and the magnetoresistive element MTJ is determined as ON state. Therefore, a resistance ratio of the ON/OFF states can be set to be high. More specifically, according to the variable resistance element RE of the first embodiment, resistances in the ON/OFF states are 17 and 0.3 kΩ, respectively, and the resistance ratio in the ON/OFF states can be improved as compared with the lone phase-change element and the lone magnetoresistive element of the comparative example. In particular, the improvement in resistance ratio in the ON/OFF states is prominent as compared with the lone magnetoresistive element.

Furthermore, according to the variable resistance element RE of the first embodiment, a magnetic field from the magnetoresistive element MTJ is applied to the phase-change element PC. As a result, for example, when a current for enabling the reading of data is allowed to flow or when a current flows because of any other unexpected operation, the phase-change element PC in the amorphous state which is the state that the data has been written does not vary to the crystalline state. That is, when the magnetic field is applied to the phase-change element PC, the phase-change element PC does not vary from the amorphous state to the crystalline state, and hence data retention characteristics can be improved.

Moreover, according to the variable resistance element RE of the first embodiment, the phase-change element PC has the superlattice structure formed of first layers 31 made of $Sb_2Te_3$ and second layers 32 made of GeTe. Therefore, the crystalline state changes to the amorphous state mainly because of a displacement of Ge in each second layer 32. That is, a change in atomic structure due to a phase change can be suppressed to the minimum level. As a result, rewriting durability can be improved. More specifically, the rewriting durability of the lone phase-change element according to the comparative example is approximately 1000 times, but this durability can be improved to 10000 times or more in the variable resistance element RE (the phase-change element PC) according to the first embodiment.

Additionally, as described above, according to the variable resistance element RE of the first embodiment, the crystalline state changes to the amorphous state mainly because of a displacement of Ge in each second layer 32, and hence a change in atomic structure due to a phase change can be suppressed to the minimum level. Therefore, an operating current required for the phase change can be also reduced. More specifically, in the lone phase-change element according to the comparative example, a pulse in the ON state is 3.0 V in 20 ns and, and a pulse in the OFF state is 10 V in 1 μs. On the other hand, in the variable resistance element RE (the phase-change element PC) according to the first embodiment, a pulse in the ON state is 1.5 V in 20 ns, and a pulse in the OFF state is approximately 0.5 V in 1 μs, and hence a low current can be realized.

When the above-described effect is obtained, the element can be miniaturized.

Further, according to the variable resistance element RE of the first embodiment, composite elements (the phase-change element PC and the magnetoresistive element MTJ) can be combined and laminated. As a result, an advanced multi-level memory element or a three-dimensional memory element string can be formed without substantially increasing a space in a direction parallel to a radial direction of the substrate (without increasing an area). That is, both density growth of the element and a reduction in cost can be achieved.

Second Embodiment

A nonvolatile semiconductor memory device according to a second embodiment will now be described with reference to FIG. 13 to FIG. 15. The second embodiment is an example that a variable resistance element RE is constituted of a phase-change element PC and one magnetoresistive element MTJ that applies a magnetic field to the phase-change elements PC is arranged. As a result, data in the phase-change elements PC to which a magnetic field is applied by one magnetoresistive element MTJ in common can be collectively erased. The second embodiment will now be described in detail.

It is to be noted that, in the second embodiment, a description on the same points as those in the first embodiment will be omitted and different points will be explained.

[Configuration]

A configuration of the nonvolatile semiconductor memory device according to the second embodiment will be first described with reference to FIG. 13.

Figure 13:
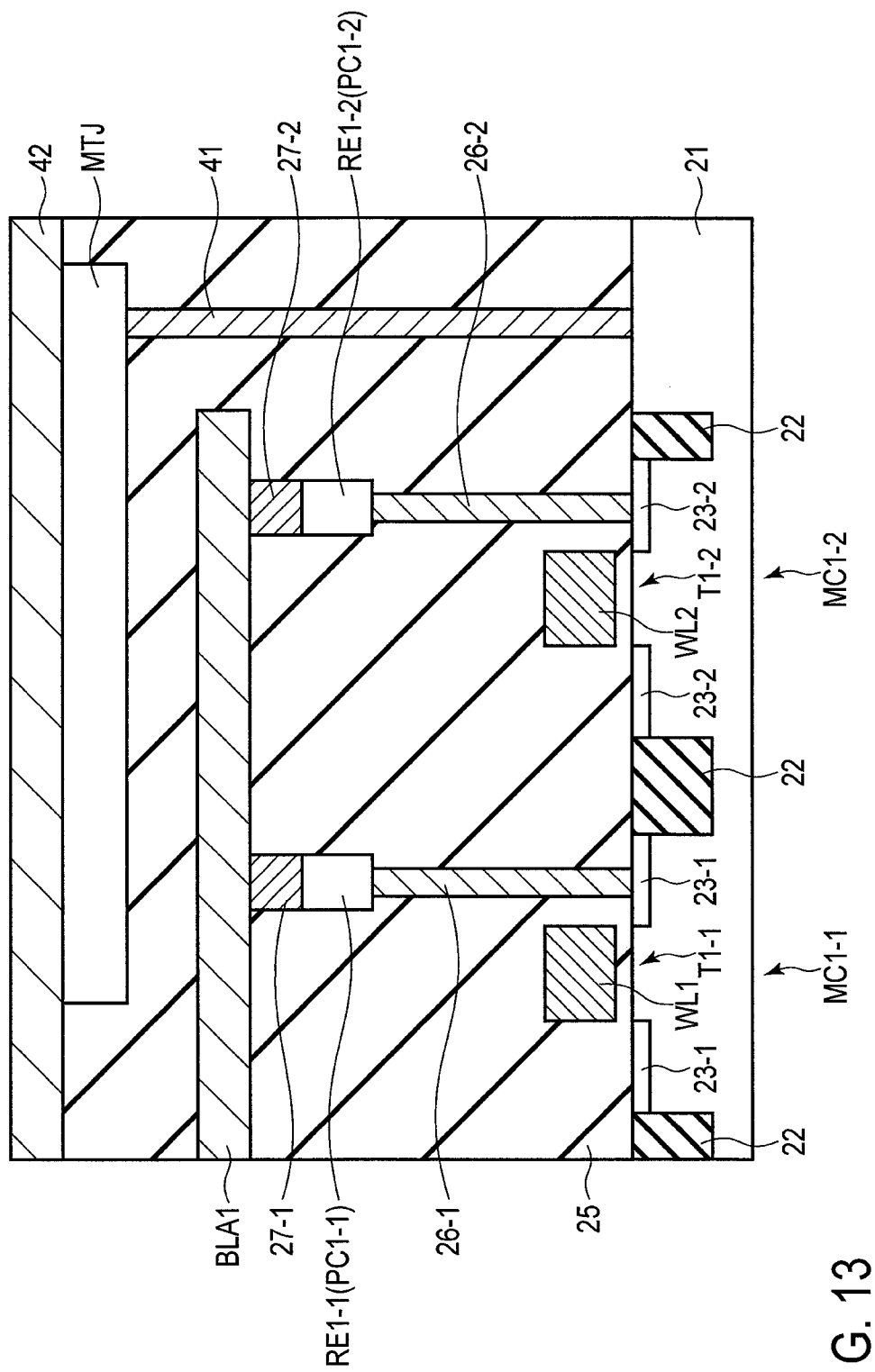
FIG. 13 is a cross-sectional view showing a configuration of a nonvolatile semiconductor memory device according to a second embodiment.

FIG. 13 is a cross-sectional view showing a configuration of the nonvolatile semiconductor memory device according to the second embodiment. Here, two neighboring memory cells MC1-1 and MC1-2 which are connected to a bit line BLA1 in FIG. 1 in common are shown. Alternatively, at least three neighboring memory cells may be connected to a bit line BLA1 in the second embodiment.

As depicted in FIG. 13, the second embodiment is different from the first embodiment in that one variable resistance element RE is constituted of one phase-change element PC and one magnetoresistive element MTJ that applies a magnetic field near the phase-change elements PC is arranged.

Memory cell MC1-1 is constituted of a switching element T1-1 arranged on a semiconductor substrate 21 and a variable resistance element RE1-1, and memory cell MC1-2 is constituted of a switching element T1-2 arranged on the semiconductor substrate 21 and a variable resistance element RE1-2. These memory cells MC1-1 and MC1-2 are adjacent to each other in a direction along which bit lines BLA are extended (a first direction). Memory cells MC1-1 and MC1-2 are separated from each other by each element isolation insulating layer 22 having an STI structure arranged in the semiconductor substrate 21.

Switching element T1-1 is FET, and it has two source/drain diffusion layers 23-1 in the semiconductor substrate 21 and a gate electrode arranged on a channel region between these layers. Further, switching element T1-2 is FET, and it has two source/drain diffusion layers 23-2 in the semiconductor substrate 21 and a gate electrode arranged on a channel region between these layers. The gate electrodes in switching elements T1-1 and T1-2 function as word lines WL1 and WL2, respectively. Each of switching elements T1-1 and T1-2 is covered with an interlayer insulating layer 25.

Contact holes are provided in the interlayer insulating layer 25, and contact plugs (lower electrodes) 26-1 and 26-2 are arranged in the contact holes, respectively. A lower surface of contact plug 26-1 is connected to switching element T1-1. In this example, contact plug 26-1 is directly in contact with the source/drain diffusion layer 23-1. Moreover, a lower surface of contact plug 26-2 is connected to switching element T1-2. In this example, contact plug 26-2 is directly in contact with the source/drain diffusion layer 23-2. Contact plugs 26-1 and 26-2 can locally change temperatures of phase-change elements PC1-1 and PC1-2 and function as heat generating layers.

Variable resistance element RE1-1 is arranged immediately above contact plug 26-1, and variable resistance element RE1-2 is arranged immediately above contact plug 26-2.

Each of variable resistance element RE1-1 and RE1-2 according to the second embodiment is constituted of a single-layer structure of a phase-change element PC1-1 or PC1-2. Each of these phase-change elements PC1-1 and PC1-2 according to the second embodiment has the same structure as each of phase-change elements PC1-1 and PC1-2 according to the first embodiment.

More specifically, each of phase-change elements PC1-1 and PC1-2 is constituted of a laminated structure in which first layers 31 and second layers 32 are alternately laminated. Each first layer 31 is made of, for example, $Sb_2Te_3$ and has a film thickness of approximately 1.0 nm. The first layer 31 is formed on the contact plug 26 as the lowermost layer of the phase-change element PC. Each second layer 32 is made of, for example, GeTe and has a film thickness of approximately 0.4 nm. Since the first layers 31 and the second layers 32 are alternately laminated, the phase-change element PC has a superlattice structure.

In addition, it is desirable for the first layer 31 formed as the lowermost layer of the phase-change element PC to have a film thickness larger than those of the first layers 31 placed above, and a film thickness of this first layer 31 is approximately 5.0 nm. As a result, the first layer 31 as the lowermost layer functions as a buffer layer on the interface with respect to the contact plug 269.

A via (an upper electrode) 27-1 is formed on variable resistance element RE1-1, and a via (an upper electrode) 27-2 is formed on variable resistance element RE1-2. Variable resistance elements RE1-1 and RE1-2 are connected to the bit lines BLA in common through upper electrodes 27-1 and 27-2, respectively.

On the other hand, a contact hole is provided in the interlayer insulating layer 25, and a contact plug (a lower electrode) 41 is arranged in the contact hole. A lower surface of the contact plug 41 is connected to, for example, a non-illustrated interconnect formed on the semiconductor substrate 21.

The magnetoresistive element MTJ is formed on the contact plug 41 in a contacting manner. The magnetoresistive element MTJ is formed to extend in, for example, the first direction, and it is formed above the bit lines BLA. At this time, it is preferable for the magnetoresistive element MTJ to overlap variable resistance elements RE1-1 and RE1-2 (phase-change elements PC1-1 and PC1-2) as seen from an upper surface thereof, but the magnetoresistive element MTJ is not restricted thereto. It is good for the magnetoresistive element MTJ to be arranged at a position where a magnetic field generated from the magnetoresistive element MTJ is applied to phase-change elements PC1-1 and PC1-2.

The magnetoresistive element MTJ has the same configuration as the first embodiment. More specifically, the magnetoresistive element MTJ comprises a memory layer 34, a tunnel barrier layer 35, a reference layer 36, and the like formed on the contact plug 41 in the mentioned order.

An upper electrode 42 is formed on the magnetoresistive element MTJ. The upper electrode 42 is made of a metal material having conductivity, and it is made of, for example, TiN. Further, the present embodiment is not restricted thereto, and the upper electrode 42 may be formed of a film containing any one of Ti, Ta, and W or a laminated film of these materials.

In the second embodiment, data is stored in phase-change elements PC1-1 and PC1-2 as the variable resistance elements RE in accordance with a magnetic field generated by the magnetoresistive element MTJ. Particulars of a write operation and an erase operation of the variable resistance element RE according to the second embodiment will be described later.

As explained above, phase-change elements PC1-1 and PC1-2 are formed as variable resistance elements RE1-1 and RE1-2, and the magnetoresistive element MTJ is formed in the vicinity thereof. The magnetoresistive element MTJ comprises at least two magnetic layers, i.e., the memory layer 34 having a variable magnetization direction and the reference layer 36 having an invariable magnetization direction. A magnetic field is generated by these magnetic layers in the vicinity of the magnetoresistive element MTJ.

The magnetic field generated by the magnetoresistive element MTJ is applied to phase-change elements PC1-1 and PC1-2 which are variable resistance elements RE1-1 and RE1-2 in common. A distribution of this magnetic field varies depending on the magnetization direction of the memory layer 34. Therefore, intensity of the magnetic field applied to phase-change elements PC1-1 and PC1-2 can be controlled based on the magnetization direction of the memory layer 34.

Operation Examples

Examples of a write operation and an erase operation of the nonvolatile semiconductor memory device according to the second embodiment will now be described.

Here, a description will be given as to an example where the magnetoresistive element MTJ is designed in such a manner that intensity of a magnetic field applied to the phase-change element PC becomes zero when the magnetoresistive element MTJ is in the P-state and that a magnetic field is applied to the phase-change element PC when the magnetoresistive element MTJ is in the A-state. More specifically, the magnetoresistive element MTJ is designed in such a manner that the intensity of the magnetic field near the interface with respect to a heat generating layer (the contact plug 26) in the phase-change element PC becomes approximately 10 kOe when the magnetoresistive element MTJ is in the A-state and that this intensity becomes substantially zero when the magnetoresistive element MTJ is in the P-state.

In the second embodiment, the magnetoresistive element MTJ and phase-change elements PC1-1 and PC1-2 are independently controlled. Further, crystalline states of phase-change elements PC1-1 and PC1-2 as memory elements are controlled by regulating a magnetization state of one magnetoresistive element MTJ, and data is stored. More specifically, data is stored in each memory element in a state that the magnetic field generated by the magnetoresistive element MTJ is not applied to phase-change elements PC1-1 and PC1-2, the data is held in a state that the magnetic field is applied, and the data in these memory elements is collectively erased in a state that the magnetic field is eliminated.

Examples of a write operation and an erase operation of the nonvolatile semiconductor memory device according to the second embodiment will now be described hereinafter in more detail.

A write operation will be first explained.

First, in each of variable resistance effect elements RE1-1 and RE1-2, the phase-change element PC is set to enter the crystalline state. That is, the phase-change element PC is set to a low-resistance state. On the other hand, the magnetoresistive element MTJ is set to enter the P-state. This is determined as an initial state corresponding to an OFF state that no data is written. At this time, intensity H of a magnetic field applied to the phase-change element PC by the magnetoresistive element MTJ is substantially zero.

Then, a current pulse is applied from lower electrode 26-1 (and/or 26-2) to upper electrode 27-1 (and/or 27-2) with respect to variable resistance element RE1-1 (and/or variable resistance element RE1-2). This current pulse is a short pulse having relatively high intensity (a high and short pulse, for example, 1.5 V, 20 ns). As a result, phase-change element PC1-1 varies from the crystalline state to the amorphous state. At this time, phase-change element PC1-1 (and/or phase-change element PC1-2) is amorphized from the vicinity of the lower electrode 26 which is the heat generating layer. Therefore, even if entire phase-change element PC1-1 (and/or the phase-change element PC1-2) does not enter the amorphous state, the vicinity of the lower electrode 26 as the heat generating layer alone may be amorphized.

In this manner, the phase-change element PC enters the high-resistance state and the ON state that data has been written.

Then, a current pulse is applied from the upper electrode 42 toward the lower electrode 41 with respect to the magnetoresistive element MTJ. This current pulse is a magnetization reversal pulse (for example, a pulse of 0.4 V and 0.5 ns is applied once or more) that reverses magnetization of the memory layer 34 of the magnetoresistive element MTJ. As a result, the magnetoresistive element MTJ varies from the A-state to the P-state.

As described above, when the magnetoresistive element MTJ enters the A-state, the magnetic field is applied to each of phase-change elements PC1-1 and PC1-2. At this time, the intensity H of the magnetic field applied to each of phase-change elements PC1-1 and PC1-2 by the magnetoresistive element MTJ is substantially a few tens of kOe. As a result, the ON state (the amorphous stage) of phase-change elements PC1-1 and PC1-2 is maintained, and the data write operation is completed.

An erase operation will now be described.

First, a current pulse is applied from the lower electrode 41 to the upper electrode 42 with respect to the magnetoresistive element MTJ. This current pulse is a magnetization reversal pulse (for example, a pulse of 0.4 V and 0.5 ns is applied once or more) that reverses magnetization of the memory layer 34 of the magnetoresistive element MTJ. As a result, the magnetoresistive element MTJ changes from the A-state to the P-state. When the magnetoresistive element MTJ enters the P-state in this manner, the magnetic field applied to each of phase-change elements PC1-1 and PC1-2 is eliminated. At this time, the intensity H of the magnetic field applied to each of phase-change element PC1-1 and PC1-2 by the magnetoresistive element MTJ is substantially zero.

Subsequently, a current pulse is applied from lower electrode 26-1 (and/or 26-2) to the upper electrode 27-1 (and/or 27-2) with respect to variable resistance element RE1-1 (and/or variable resistance element RE1-2). This current pulse is a long pulse having relatively low intensity (a low and long pulse, for example, 0.5 V, 1 μs). At this time, since the magnetic field generated by the magnetoresistive element MTJ is not applied to each of phase-change elements PC1-1 and PC1-2, phase-change element PC1-1 (and/or phase-change element PC1-2) varies from the amorphous state to the crystalline state.

In this manner, each of phase-change elements PC1-1 and PC1-2 returns to the OFF state (the crystalline state), and the collective data erase operation is completed.

[Effects]

According to the second embodiment, each of phase-change elements PC1-1 and PC1-2 is formed as the memory element, and one magnetoresistive element MTJ that applies a magnetic field to each of phase-change elements PC1-1 and PC1-2 in common is arranged. As a result, controlling the magnetization state of the one magnetoresistive element MTJ enables the crystalline state of each of phase-change elements PC1-1 and PC1-2 to be controlled, and hence data in each memory element can be collectively erased.

Further, phase-change elements PC1-1 and PC1-2 and the magnetoresistive element MTJ are not formed in the laminated structure, but they are separately and independently formed. As a result, phase-change elements PC1-1 and PC1-2 and the magnetoresistive element MTJ can be independently controlled, and an operating speed can be improved as compared with the first embodiment.

It is to be noted that the description has been given as to the situation where the magnetoresistive element MTJ extends in the first direction, but the present embodiment is not restricted thereto. The magnetoresistive element MTJ may be formed to extend in a second direction orthogonal to the first direction, or it may be formed into a planar shape. That is, data in memory cells adjacent in the second direction (for example, memory cells MC1-1 and MC2-1) may be collectively erased, or data in memory cells adjacent in the first direction and the second direction (for example, memory cells MC1-1, MC1-2, MC2-1, and MC2-2) may be collectively erased.

[Modification]

A modification of the configuration of the nonvolatile semiconductor memory device according to the second embodiment will now be described with reference to FIG. 14 and FIG. 15. The modification is an example that the second embodiment is applied to a so-called cross-point-type memory cell array. In the modification, a description on the same points as those in the second embodiment will be omitted, and different points will be mainly explained.

FIG. 14 is a circuit diagram showing a modification of the configuration of the nonvolatile semiconductor memory device according to the second embodiment.

As shown in FIG. 14, memory cells MC1-1, MC1-2, MC2-1, and MC2-2 in a memory cell array MA are arranged in a matrix form. Memory cell MC1-1 comprises a series-connected body in which one end of a variable resistance element RE1-1 is connected to a cathode of a rectifying element (for example, a diode) D1-1. Likewise, memory cell MC1-2 comprises a series-connected body in which one end of a variable resistance element RE1-2 is connected to a cathode of a rectifying element D1-2, memory cell MC2-1 comprises a series-connected body in which one end of a variable resistance element RE2-1 is connected to a cathode of a rectifying element D2-1, and memory cell MC2-2 comprises a series-connected body in which one end of a variable resistance element RE2-2 is connected to a cathode of a rectifying element D2-2.

One end of the series-connected body (the other end of each of variable resistance elements RE1-1 and RE1-2) of each of memory cells MC1-1 and MC1-2 is connected to a bit line BL1 in common, and one end of the series-connected body (the other end of each of variable resistance elements RE2-1 and RE2-2) of each of memory cells MC2-1 and MC2-2 is connected to a bit line BL2 in common. On the other hand, one end of the series-connected body (an anode of each of rectification elements D1-1 and D1-2) of each of memory cells MC1-1 and MC2-1 is connected to a word line WL1 in common, and one end of the series-connected body (an anode of each of rectification elements D1-2 and D2-2) of each of memory cells MC1-2 and MC2-2 is connected to a word line WL2 in common.

Potentials on word lines WL1 and WL2 are controlled by a first control circuit 11. Furthermore, potentials on bit lines BLA1, BLA2, BLB1, and BLB2 are controlled by a second control circuit 12.

Figure 15:
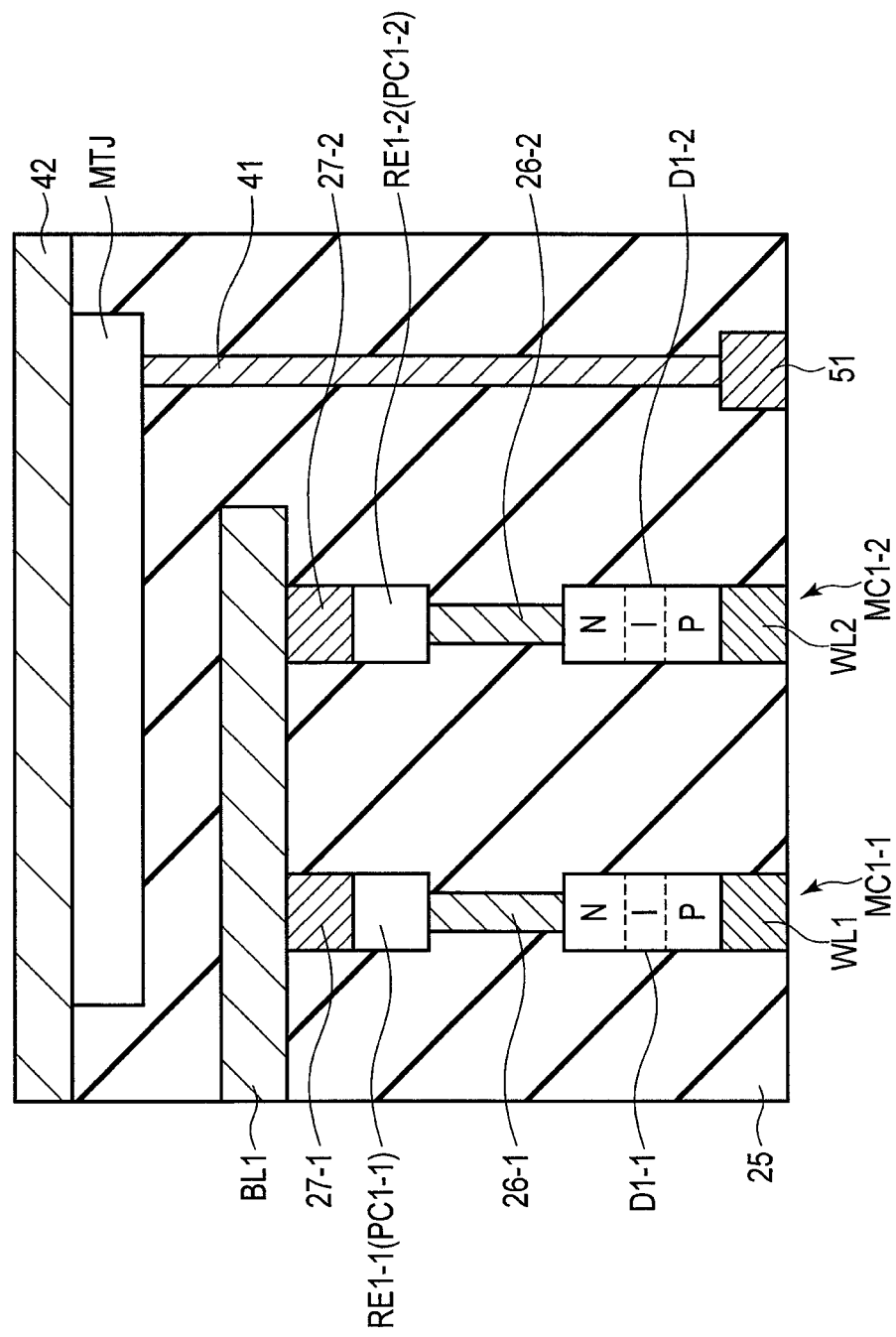
FIG. 15 is a cross-sectional view showing the modification of the configuration of the nonvolatile semiconductor memory device according to the second embodiment.

FIG. 15 is a cross-sectional view showing the modification of the configuration of the nonvolatile semiconductor memory device according to the second embodiment. Here, the neighboring two memory cells MC1-1 and MC1-2 connected to bit line BL1 in FIG. 14 in common are shown.

As depicted in FIG. 15, memory cell MC1-1 is constituted of rectification element D1-1 and variable resistance element RE1-1 arranged at an intersecting position of bit line BL1 extending in a first direction and word line WL1 extending in a second direction orthogonal to the first direction, and memory cell MC1-2 is constituted of rectification element D1-2 and variable resistance element RE1-2 arranged at an intersecting position of bit line BL1 extending in the first direction and word line WL2' extending in the second direction. That is, each of memory cells MC1-1 and MC1-2 has a so-called cross-point-type structure. These memory cells MC1-1 and MC1-2 are adjacent to each other along the first direction.

Rectification element D1-1 is formed on word line WL1, and rectification element D1-2 is formed on word line WL2. Each of rectification elements D1-1 and D1-2 is, for example, a PIN diode (a region of a P+ type, a region of an N− type, and a region of an N+ type from the lower side). It is to be noted that each of rectification elements D1-1 and D1-2 is not restricted to the PIN diode, and it may be a tunnel diode (a region of the P+ type, a tunnel oxide film, and a region of the N+ type from the lower side) such as silicon-insulator-silicon (SIS).

A lower electrode 26-1 is formed on rectification element D1-1, and a lower electrode 26-2 is formed on rectification element D1-2. Contact plugs 26-1 and 26-2 can locally change temperatures of phase-change elements PC1-1 and PC1-2, respectively, and they function as heat generating layers.

Variable resistance element RE1-1 is arranged immediately above contact plug 26-1, and variable resistance element RE1-2 is arranged immediately above contact plug 26-2.

An upper electrode 27-1 is formed on variable resistance element RE1-1, and an upper electrode 27-2 is formed on variable resistance element RE1-2. Variable resistance elements RE1-1 and RE1-2 are connected to bit lines BL1 in common through upper electrodes 27-1 and 27-2, respectively.

On the other hand, a contact hole is provided in an interlayer insulating layer 25, and a lower electrode 41 is arranged in the contact hole. A lower surface of the contact plug 41 is connected to, for example, an interconnect 51.

The magnetoresistive element MTJ is formed on the contact plug 41 in a contacting manner. The magnetoresistive element MTJ is formed to extend in, for example, the first direction, and it is formed above bit line BL1. At this time, it is desirable for the magnetoresistive element MTJ to overlap variable resistance elements RE1-1 and RE1-2 (phase-change elements PC1-1 and PC1-2) as seen from an upper surface thereof, but the present embodiment is not restricted thereto. It is good to arrange the magnetoresistive element MTJ at a position where a magnetic field generated from the magnetoresistive element MTJ is applied to each of phase-change elements PC1-1 and PC1-2. An upper electrode 42 is formed on the magnetoresistive element MTJ.

In the modification, the same write operation and erase operation as those in the second embodiment are likewise executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate; and
   a memory cell which is arranged on the semiconductor substrate and comprises a variable resistance element,
   wherein the variable resistance element comprises a laminated structure including: a phase-change element which has at least two different crystalline resistance states by varying a crystalline state and includes a chalcogenide material; and a magnetoresistive element which has at least two different magnetization resistance states by varying a magnetization state, and applies or does not apply a magnetic field to the phase-change element in accordance with the magnetization state.

2. The device of claim 1, wherein the phase-change element has a laminated structure in which first layers including a compound containing at least one of Sb, Te, Ag, Al, Au, Bi, Cu, Ga, In, Si, and Zn and second layers including a compound containing at least one of Ge and Al, and Te are alternately laminated.

3. The device of claim 1, wherein the phase-change element has a laminated structure in which first layers including $Sb_2Te_3$ and second layers including GeTe are alternately laminated.

4. The device of claim 1, wherein the phase-change element has a single-layer structure including a compound containing at least one of Sb, Te, Ag, Al, Au, Bi, Cu, Ga, Ge, In, Si, and Zn.

5. The device of claim 1, wherein the variable resistance element further comprises a barrier layer formed between the phase-change element and the magnetoresistive element.

6. The device of claim 5, wherein the barrier layer includes at least one of Ag, Al, Au, Cr, Ru, Ta, Ti, Pd, and Pt.

7. The device of claim 1, wherein the magnetoresistive element comprises a memory layer which has magnetic anisotropy in a direction perpendicular to a film surface and a variable magnetization direction, a reference layer which has magnetic anisotropy in the direction perpendicular to the film surface and an invariable magnetization direction, and a tunnel barrier layer which is formed between the memory layer and the reference layer.

8. The device of claim 1, wherein each of the memory layer and the reference layer includes TbCoFe, and the tunnel barrier layer includes one of MgO and $Al_2O_3$.

9. The device of claim 1, wherein the memory cell further comprises a heat generating layer which is in contact with the phase-change element.

10. The device of claim 1, wherein the heat generating layer includes one of W, WN, Ti, TiN, TiSiN, Ta, TaN, and TaSiN.

11. An operating method of a nonvolatile semiconductor memory device comprising: a semiconductor substrate; and a memory cell which is arranged on the semiconductor substrate and comprises a variable resistance element,
wherein the variable resistance element comprises a laminated structure including: a phase-change element which has at least two different resistance states by varying a crystalline state; and a magnetoresistive element which has at least two different resistance states by varying a magnetization state, and applies a magnetic field to the phase-change element or sets the magnetic field for the phase-change element to zero in accordance with the magnetization state, and
at a time of writing data into the variable resistance element,
a first write current pulse is applied to the variable resistance element, thereby the crystalline state of the phase-change element is changed from a first crystalline state to a second crystalline state, and a resistance state of the phase-change element is changed from a first crystalline resistance state to a second crystalline resistance state, and
a second write current pulse is applied to the variable resistance element, thereby the magnetization state of the magnetoresistive element is changed from a first magnetization state to a second magnetization state, the resistance state of the magnetoresistive element is changed from a first magnetization resistance state to a second magnetization resistance state, and the magnetoresistive element is changed to the second magnetization state to apply a magnetic field to the phase-change element.

12. The method of claim 11,
wherein at a time of erasing data in the variable resistance element,
a first erase current pulse is applied to the variable resistance element, thereby the magnetization state of the magnetoresistive element is changed from the second magnetization state to the first magnetization state, the resistance state of the magnetoresistive element is changed from the second magnetization resistance state to the first magnetization resistance state, and the magnetoresistive element is changed to the first magnetization state to set the magnetic field for the phase-change element to zero, and
a second erase current pulse is applied to the variable resistance element, thereby the crystalline state of the phase-change element is changed from the second crystalline state to the first crystalline state, and the resistance state of the phase-change element is changed from the second crystalline resistance state to the first crystalline resistance state.

13. The method of claim 11, wherein the phase-change element has a laminated structure in which first layers including a compound containing at least one of Sb, Te, Ag, Al, Au, Bi, Cu, Ga, In, Si, and Zn and second layers including a compound containing one of Ge and Al, and Te are alternately laminated.

14. The method of claim 13, wherein the first crystalline state is a crystalline state that Ge in the second layer is diffused in the second layer, and the second crystalline state is a crystalline state that Ge in the second layer is diffused to an interface side with respect to the first layer.

15. The method of claim 11, wherein the magnetoresistive element comprises a memory layer which has magnetic anisotropy in a direction perpendicular to a film surface and a variable magnetization direction, a reference layer which has magnetic anisotropy in the direction perpendicular to the film surface and an invariable magnetization direction, and a tunnel barrier layer which is formed between the memory layer and the reference layer.

16. The method of claim 15, wherein the first magnetization state is a magnetization state that the magnetization direction of the reference layer is equal to the magnetization direction of the memory layer, and the second magnetization state is a magnetization state that the magnetization direction of the reference layer is opposite to the magnetization direction of the memory layer.

17. The method of claim 11, wherein the phase-change element has a laminated structure in which first layers including $Sb_2Te_3$ and second layers including GeTe are alternately laminated.

18. The method of claim 11, wherein the phase-change element has a single-layer structure including a compound containing at least one of Sb, Te, Ag, Al, Au, Bi, Cu, Ga, Ge, In, Si, and Zn.

19. The method of claim 11, wherein the variable resistance element further comprises a barrier layer formed between the phase-change element and the magnetoresistive element.

20. The device of claim 19, wherein the barrier layer includes at least one of Ag, Al, Au, Cr, Ru, Ta, Ti, Pd, and Pt.

* * * * *